US012196815B2

(12) United States Patent
Westerby et al.

(10) Patent No.: US 12,196,815 B2
(45) Date of Patent: Jan. 14, 2025

(54) DETECTING BATTERY PACK TYPE BASED ON BATTERY PACK IMPEDANCE

(71) Applicant: MILWAUKEE ELECTRIC TOOL CORPORATION, Brookfield, WI (US)

(72) Inventors: Carl B. Westerby, Menomonee Falls, WI (US); Griffin M. Steffy, Westfield, IN (US); Alex R. Kuhls, Menomonee Falls, WI (US); Jonathan E. Abbott, Milwaukee, WI (US); Alexander T. Huber, Menomonee Falls, WI (US); Gareth Mueckl, Milwaukee, WI (US); Douglas R. Fieldbinder, Greendale, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 106 days.

(21) Appl. No.: 17/512,120

(22) Filed: Oct. 27, 2021

(65) Prior Publication Data

US 2022/0137147 A1 May 5, 2022

Related U.S. Application Data

(60) Provisional application No. 63/136,794, filed on Jan. 13, 2021, provisional application No. 63/107,263, filed on Oct. 29, 2020.

(51) Int. Cl.
*G01R 31/389* (2019.01)
*B25F 5/02* (2006.01)
(Continued)

(52) U.S. Cl.
CPC .............. *G01R 31/389* (2019.01); *B25F 5/02* (2013.01); *G01R 31/3842* (2019.01);
(Continued)

(58) Field of Classification Search
CPC ............ G01R 31/389; G01R 31/3842; H01M 2010/4278; H01M 10/48; H01M 2220/30
(Continued)

(56) References Cited

U.S. PATENT DOCUMENTS

| 5,268,845 A | 12/1993 | Startup et al. |
| 5,365,453 A | 11/1994 | Startup et al. |

(Continued)

FOREIGN PATENT DOCUMENTS

| JP | H06194428 A | 7/1994 |
| JP | 2007520180 A | 7/2007 |

(Continued)

OTHER PUBLICATIONS

International Search Report and Written Opinion for Application No. PCT/US2021/056812 dated Mar. 11, 2022 (14 pages).
(Continued)

*Primary Examiner* — Alexander Satanovsky
*Assistant Examiner* — Trung Q Nguyen
(74) *Attorney, Agent, or Firm* — Michael Best & Friedrich LLP

(57) ABSTRACT

A device, such as a power tool, configured to receive a battery pack that is operable to determine a type of battery pack that is attached to the device. When the battery pack is connected to the device, the device is configured to determine an impedance of the battery pack. Based on the determined impedance of the battery pack, the device is capable of detecting the particular type of battery pack that has been attached. In some embodiments, the device is configured to be controlled based on the type of battery pack that has been detected by the device.

20 Claims, 32 Drawing Sheets

(51) Int. Cl.
*G01R 31/3842* (2019.01)
*H01M 10/42* (2006.01)
*H01M 10/48* (2006.01)

(52) U.S. Cl.
CPC .... *H01M 10/48* (2013.01); *H01M 2010/4278* (2013.01); *H01M 2220/30* (2013.01)

(58) Field of Classification Search
USPC .................................................. 324/425–430
See application file for complete search history.

(56) References Cited

U.S. PATENT DOCUMENTS

| | | | |
|---|---|---|---|
| 5,438,248 A | 8/1995 | Hyuck | |
| 6,456,988 B1 | 9/2002 | Singh et al. | |
| 6,472,847 B2 | 10/2002 | Lundberg | |
| 6,668,247 B2 | 12/2003 | Singh et al. | |
| 6,691,095 B2 | 2/2004 | Singh et al. | |
| 6,809,649 B1 | 10/2004 | Wendelrup et al. | |
| 7,051,008 B2 | 5/2006 | Singh et al. | |
| 7,079,038 B2 | 7/2006 | Wendelrup et al. | |
| 7,119,516 B2 | 10/2006 | Denning | |
| 7,382,270 B2 | 6/2008 | Wendelrup et al. | |
| 7,719,234 B2 | 5/2010 | Carrier et al. | |
| 8,415,926 B2 | 4/2013 | Bhardwaj et al. | |
| 8,598,849 B2 | 12/2013 | Bhardwaj et al. | |
| 9,131,452 B2 | 9/2015 | Bartels et al. | |
| 9,500,538 B2 | 11/2016 | Maleki et al. | |
| 9,537,335 B2 | 1/2017 | Furui et al. | |
| 9,577,450 B2 | 2/2017 | Yoshikawa et al. | |
| 9,595,839 B2 | 3/2017 | Furui et al. | |
| 9,780,583 B2 | 10/2017 | Furui et al. | |
| 9,897,661 B2 | 2/2018 | Nelson et al. | |
| 10,090,692 B2 | 10/2018 | Yoshikawa et al. | |
| 10,124,455 B2 | 11/2018 | Ito et al. | |
| 10,396,573 B2 | 8/2019 | Furui et al. | |
| 11,579,206 B2 | 2/2023 | Nicklaus et al. | |
| 2002/0001745 A1* | 1/2002 | Gartstein | H01M 6/5044 320/132 |
| 2007/0052424 A1 | 3/2007 | Okumura | |
| 2008/0203995 A1* | 8/2008 | Carrier | H01M 10/425 320/135 |
| 2008/0309289 A1* | 12/2008 | White | H02J 7/0063 320/136 |
| 2009/0183888 A1 | 7/2009 | Forster et al. | |
| 2014/0019789 A1 | 1/2014 | Bhardwaj et al. | |
| 2014/0151079 A1 | 6/2014 | Furui et al. | |
| 2019/0334357 A1 | 10/2019 | Furui et al. | |
| 2020/0052479 A1* | 2/2020 | Friedman | H02H 7/20 |
| 2020/0174080 A1 | 6/2020 | Feldman et al. | |
| 2021/0119514 A1* | 4/2021 | Cox | H02K 11/0094 |
| 2021/0391741 A1* | 12/2021 | Rigdon | H02J 7/005 |

FOREIGN PATENT DOCUMENTS

| | | |
|---|---|---|
| WO | 2008156567 A1 | 12/2008 |
| WO | 2014153034 A1 | 9/2014 |
| WO | 2020108970 A1 | 6/2020 |

OTHER PUBLICATIONS

Extended European Search Report for Application No. 21887424.6 dated Sep. 4, 2024 (9 pages).

* cited by examiner

DETECTING BATTERY PACK TYPE BASED ON BATTERY PACK IMPEDANCE

RELATED APPLICATION

This application claims the benefit of U.S. Provisional Patent Application No. 63/107,263, filed on Oct. 29, 2020, and U.S. Provisional Patent Application No. 63/136,794, filed Jan. 13, 2021, the entire content of each of which is hereby incorporated by reference.

BACKGROUND

Embodiments described herein provide battery pack powered power tools.

SUMMARY

Devices, such as power tools, may be configured to receive a plurality of different types of battery packs. Battery packs may differ based on a multitude of different features, such as battery cell count, chemistry, battery age, temperature, state of health, state of charge, etc. Because the diversity among different battery packs is prevalent, for the full potential of the battery packs and battery pack powered devices to be achieved, a device should operate differently based on the type, characteristics, and/or state of battery pack attached. Therefore, it would be advantageous for a method or system that would allow a device to differentiate the different types of battery packs. This would allow a user to utilize the device and battery pack at their most ideal capability. In some embodiments, two or more battery packs may be connected to the tool. This could be used to evaluate each of the connected battery packs independently, or be used with the batteries in parallel or series for a 'grand-total' effect.

Embodiments described herein provide a device, such as a power tool. The power tool includes a housing having a handle and a battery pack interface. The power tool includes a motor (e.g., a brushless direct current motor) within the housing. The motor includes a rotor and a stator. The rotor is coupled to a motor shaft to produce a rotational output. In another embodiment, the power tool may lack a motor, and instead include a powered light. The powered light may use an inrush technique with a particular resistive and/or inductive load to determine impedance. This technique may help the powered light to estimate the capacity of the battery. In another embodiment, the power tool may include a solenoid. The solenoid does not include a rotor. However, the solenoid may operate with windings in a similar way to that of the motor. The power tool includes a first sensing circuit configured to detect a battery pack voltage of a battery pack connected to the battery pack interface, and a second sensing circuit configured to detect a current from the battery pack. The power tool further includes a controller. The controller includes a processor and a memory. The controller is configured to receive a first signal from the first sensing circuit related to a first battery voltage. The controller is further configured to receive a second signal from the second sensing circuit related to the current from the battery pack, and receive a third signal from the first sensing circuit related to a second measurement of battery pack voltage. The controller is further configured to determine a battery pack impedance based on the first measurement of battery pack voltage, the second measurement of battery pack voltage, and the current from the battery pack. The controller is then configured to control the motor based on the battery pack impedance.

Power tool described herein include a housing, a motor, a first sensing circuit, a second sensing circuit, and a controller. The housing includes a handle and a battery pack interface. The motor is within the housing. The motor includes a rotor and a stator. The rotor is coupled to a motor shaft to produce a rotational output. The first sensing circuit is configured to detect a battery pack voltage of a battery pack connected to the battery pack interface. The second sensing circuit is configured to detect a current from the battery pack. The controller includes a processor and a memory. The controller is configured to receive a first signal from the first sensing circuit related to a first measurement of battery pack voltage, receive a second signal from the second sensing circuit related to the current from the battery pack, receive a third signal from the first sensing circuit related to a second measurement of battery pack voltage, determine a battery pack impedance based on the first measurement of battery pack voltage, the second measurement of battery pack voltage, and the current from the battery pack, and control the motor based on the battery pack impedance.

In some aspects, the power tool is operable to receive a first battery pack containing a first number of battery cells.

In some aspects, the power tool is operable to determine an impedance of the first battery pack containing the first number of battery cells.

In some aspects, the power tool is operable to receive a second battery pack containing a second number of battery cells, the second number of battery cells being different than the first number of battery cells.

In some aspects, the power tool is operable to determine an impedance of the second battery pack containing the second number of battery cells.

In some aspects, the power tool is operable to determine a battery pack type for the battery pack connected to the battery pack interface based on the battery pack impedance.

In some aspects, the power tool is operable to determine a frequency characteristic based on the battery pack impedance.

In some aspects, the power tool is operable to determine a motor inertia based on the battery pack impedance.

In some aspects, the power tool is operable to determine a size of the battery pack based on the battery pack impedance.

In some aspects, the power tool is operable to estimate a battery pack temperature based on the battery pack impedance.

In some aspects, an output power of the battery pack is reduced when the battery pack temperature is above a predetermined threshold.

In some aspects, the power tool is operable to determine whether the power tool is currently running.

In some aspects, the current from the battery pack is lowered when the battery pack temperature is below a predetermined threshold.

In some aspects, a warm airflow is selectively driven over the battery pack when the battery pack temperature is below a predetermined threshold.

In some aspects, the power tool is operable to determine a battery pack capacity based on the battery pack impedance.

In some aspects, the power tool is operable to determine a battery pack efficiency based on the battery pack capacity.

In some aspects, the power tool is operable to alert a user of a remaining power duration of the battery pack.

In some aspects, the power tool is operable to alert a user of a state of charge of the battery pack.

In some aspects, the power tool is operable to determine if the battery pack is capable of a high output current.

In some aspects, the power tool is operable to control phase advance and field weakening.

In some aspects, the power tool is operable to prioritize high power output.

In some aspects, the power tool outputs a flat speed response under various loads.

In some aspects, the power tool is operable to deprioritize a power tool runtime and a power tool efficiency.

In some aspects, the power tool is operable to determine an ampere-hour capacity of the battery pack based on the battery pack impedance.

In some aspects, the power tool is operable to lower an output power of the power tool to increase an amount of runtime.

In some aspects, the power tool is operable to modify a parameter in a bind-up algorithm for detecting a bind-up condition.

In some aspects, the power tool is operable to modify a parameter in a braking response after detecting the bind-up condition.

In some aspects, the power tool is operable to determine that the battery pack has a high battery pack impedance, and adjust motor control parameters to increase torque delivery when the battery pack has the high battery pack impedance.

Methods described herein provide for controlling a power tool. The methods include receiving a first signal from a first sensing circuit related to a first measurement of battery pack voltage of a battery pack, receiving a second signal from a second sensing circuit related to a current from the battery pack, receiving a third signal from the first sensing circuit related to a second measurement of battery pack voltage of the battery pack, determining a battery pack impedance based on the first measurement of battery pack voltage, the second measurement of battery pack voltage, and the current from the battery pack, determining a battery pack type based on the battery pack impedance, and controlling a motor based on the battery pack type.

In some aspects, the methods also include receiving a first battery pack containing a first number of battery cells.

In some aspects, the methods also include determining an impedance of the first battery pack containing the first number of battery cells.

In some aspects, the methods also include receiving a second battery pack containing a second number of battery cells, the second number of battery cells being different than the first number of battery cells.

In some aspects, the methods also include determining an impedance of the second battery pack containing the second number of battery cells.

In some aspects, the methods also include determining a battery pack type for the battery pack based on the battery pack impedance.

In some aspects, the methods also include determining a frequency characteristic based on the battery pack impedance.

In some aspects, the methods also include determining a motor inertia based on the battery pack impedance.

In some aspects, the methods also include determining a size of the battery pack based on the battery pack impedance.

In some aspects, the methods also include estimating a battery pack temperature based on the battery pack impedance.

In some aspects, the methods also include reducing an output power of the battery pack when the battery pack temperature is above a predetermined threshold.

In some aspects, the methods also include determining whether the power tool is currently running.

In some aspects, the methods also include reducing a current of the battery pack when the temperature is below a predetermined threshold.

In some aspects, the methods also include selectively driving a warm airflow over the battery pack when the temperature is below a predetermined threshold.

In some aspects, the methods also include determining a battery pack capacity based on the battery pack impedance.

In some aspects, the methods also include determining a battery pack efficiency based on the battery pack capacity.

In some aspects, the methods also include alerting a user of a remaining power duration of the battery pack.

In some aspects, the methods also include alerting a user of a state of charge of the battery pack.

In some aspects, the methods also include determining if the battery pack is capable of a high output current.

In some aspects, the methods also include controlling phase advance and field weakening.

In some aspects, the methods also include prioritizing high power output.

In some aspects, the methods also include outputting a flat speed response under various loads.

In some aspects, the methods also include deprioritizing a power tool runtime and a power tool efficiency.

In some aspects, the methods also include determining an ampere-hour capacity of the battery pack based on the battery pack impedance.

In some aspects, the methods also include adjusting the power tool to have a lower output for a longer amount of runtime.

In some aspects, the methods also include lowering an output power of the power tool to increase an amount of runtime.

In some aspects, the methods also include modifying a parameter in a braking response after detecting a bind-up condition.

In some aspects, the methods also include determining that the battery pack has a high battery pack impedance, and adjusting motor control parameters to increase torque delivery when the battery pack has the high battery pack impedance.

Methods described herein provide for controlling a battery pack powered device. The methods include receiving a first signal from a first sensing circuit related to a first measurement of battery pack voltage of a battery pack, receiving a second signal from a second sensing circuit related to a current from the battery pack, receiving a third signal from the first sensing circuit related to a second measurement of battery pack voltage, determining a battery pack impedance based on the first measurement of battery pack voltage, the second measurement of battery pack voltage, and the current from the battery pack, and controlling the battery pack powered device based on the battery pack impedance.

Battery pack powered devices described herein include a housing including a battery pack interface configured to receive a battery pack, a first sensing circuit configured to detect a battery pack voltage of the battery pack, a second sensing circuit configured to detect a current from the battery pack, and a controller including a processor and a memory. The controller is configured to receive a first signal from the first sensing circuit related to a first measurement of battery pack voltage, receive a second signal from the second sensing circuit related to the current from the battery pack, receive a third signal from the first sensing circuit related to a second measurement of battery pack voltage, determine a battery pack impedance based on the first measurement of battery pack voltage, the second measurement of battery pack voltage, and the current from the battery pack, and control the battery pack powered device based on the battery pack impedance.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

It should be understood that although certain drawings illustrate hardware and software located within particular devices, these depictions are for illustrative purposes only. Functionality described herein as being performed by one component may be performed by multiple components in a distributed manner. Likewise, functionality performed by multiple components may be consolidated and performed by a single component. In some embodiments, the illustrated components may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links. Similarly, a component described as performing particular functionality may also perform additional functionality not described herein. For example, a device or structure that is "configured" in a certain way is configured in at least that way but may also be configured in ways that are not explicitly listed.

Other aspects of the embodiments will become apparent by consideration of the detailed description and accompanying drawings.

DETAILED DESCRIPTION

Figure 1A:
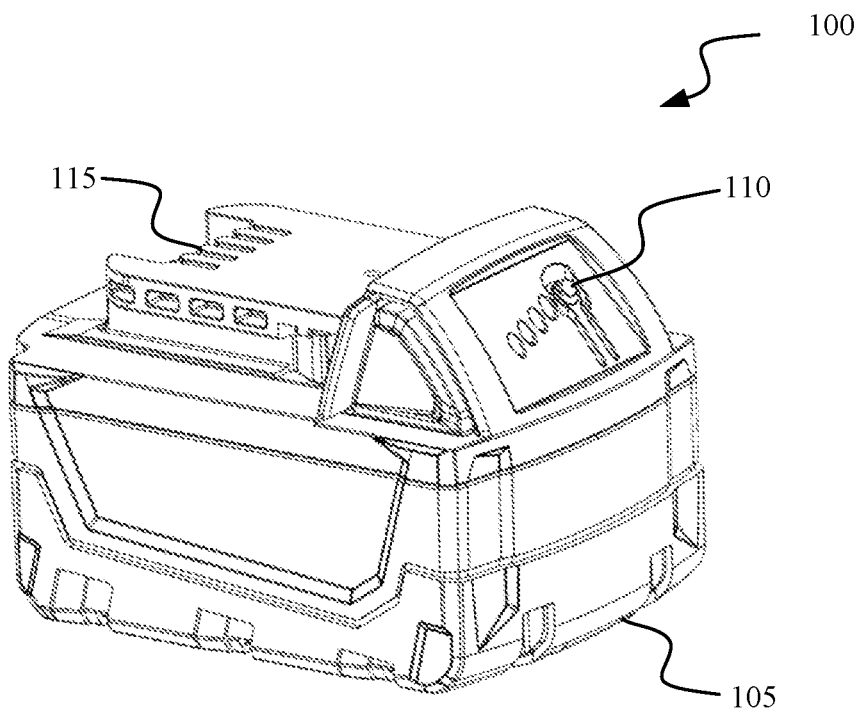
FIG. 1A illustrates a battery pack according to embodiments described herein.

FIG. 1A illustrates a battery pack 100. The battery pack 100 includes a housing 105, a user interface portion 110 for providing a state-of-charge indication for the battery pack 100, and a device interface portion 115 for connecting the battery pack 100 to a device (e.g., a power tool). The battery pack 100 includes a plurality of battery cells within the housing 105.

Figure 1B:
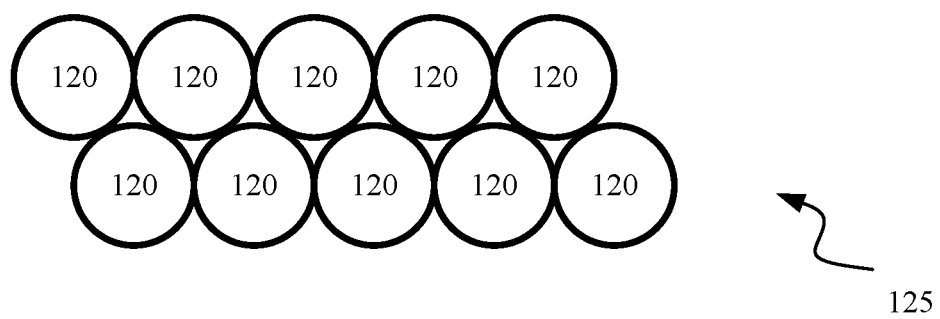
FIG. 1B illustrates a group of battery cells according to embodiments described herein.

FIG. 1B illustrates a group 125 of battery cells 120 that include, for example, ten individual battery cells 120. The battery cells 120 can be located within the housing 105 of the battery pack 100. In some embodiments, the battery pack 100 includes more or fewer than 10 battery cells within the housing 105.

Figure 2A:
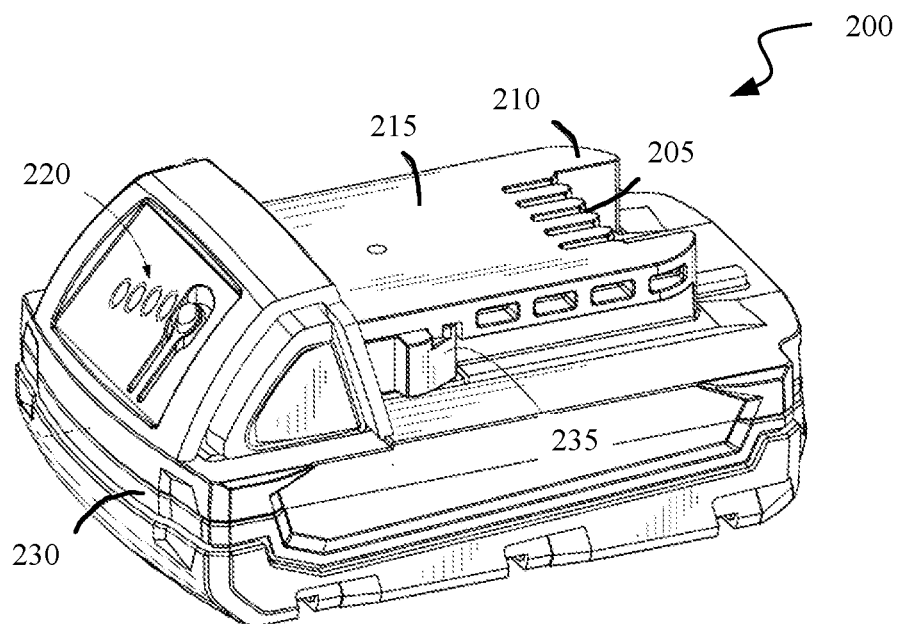
FIG. 2A illustrates a battery pack according to embodiments described herein.

FIG. 2A illustrates a battery pack 200, such as a battery pack 200 for powering a power tool. The battery pack 200 includes a battery housing 230 and, with reference to FIG. 2B, a plurality of battery cells 290.

Figure 2B:
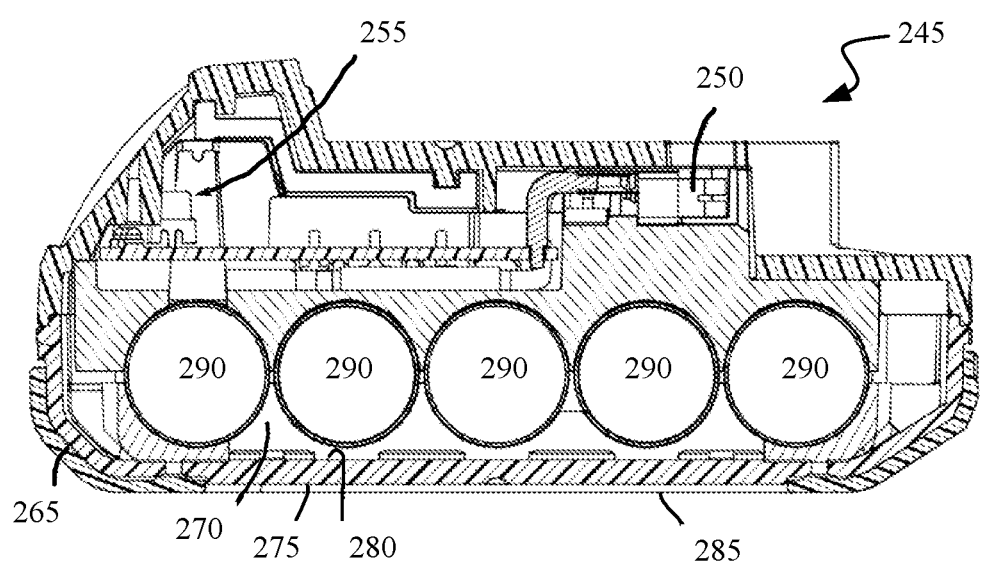
FIG. 2B illustrates a group of battery cells according to embodiments described herein.

FIG. 2B illustrates an interior view 245 containing the battery housing 230 includes a wall 265 having an inside surface 280 and an outside surface 275. The inside surface 280 defines an internal cavity 270. The outside surface 275 includes a top surface portion 215 (FIG. 2A) and a bottom portion 285. Referring to FIG. 2B, the battery cells 290 disposed within the cavity 270 are connected in series to battery contacts 205. Referring back to FIG. 2A, a plurality of contacts 250 (FIG. 2B) are disposed on the top surface portion 215, within a battery contacts housing extension 210. The housing extension 210 is configured to matingly engage with one or more power tools or powered accessories. A battery charge level indicator 220 is also disposed on the housing (FIG. 2A), while additional battery charging, monitoring, and indication components 255 are disposed within the cavity 270 (FIG. 2B). As shown in FIG. 2A, two tabs 235 are coupled to the housing 230 for releasably securing the housing 230 to a power tool. Corresponding features to those described above with respect to the battery pack 200 can also be included in the battery pack 100.

Figure 3:
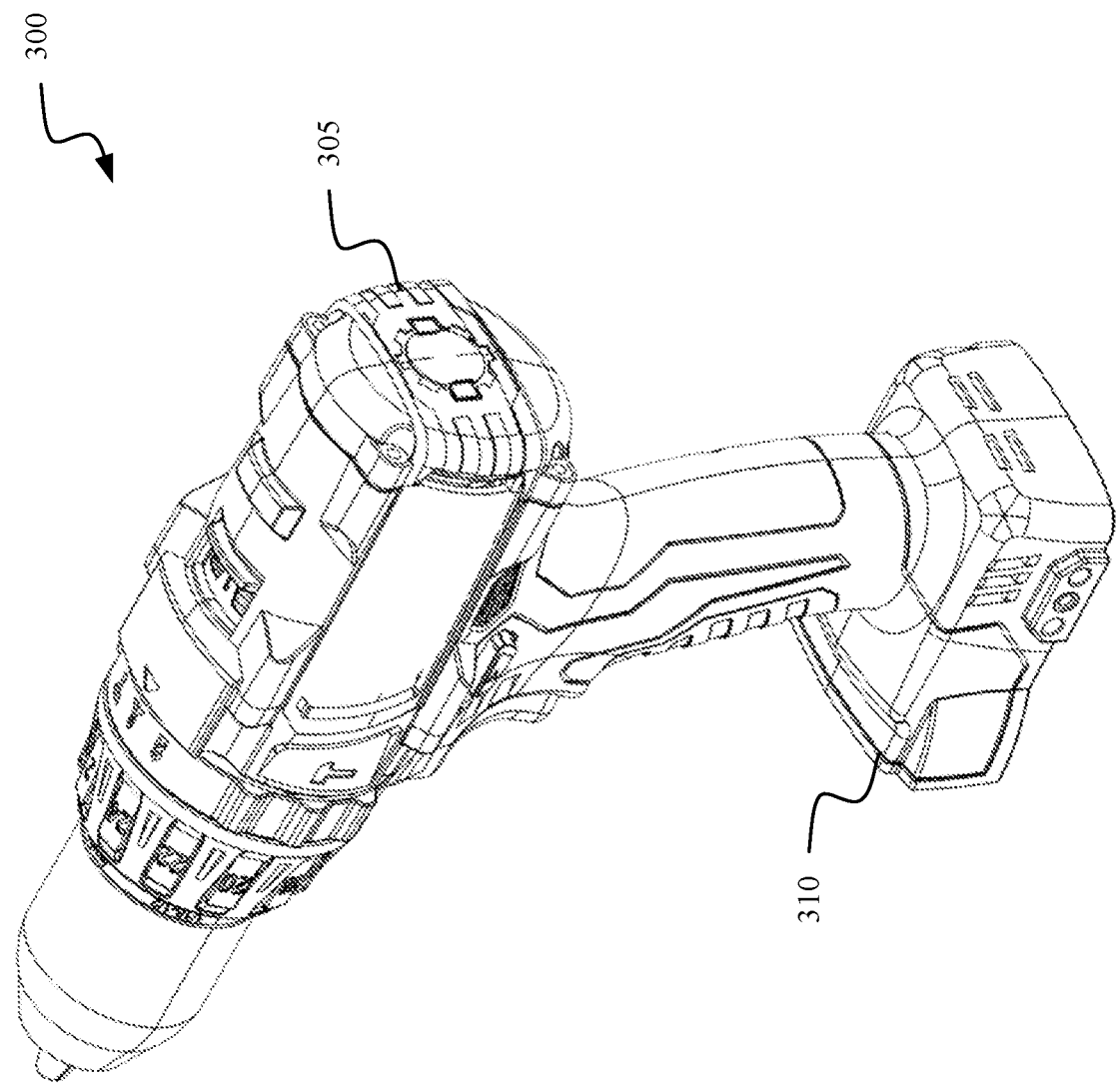
FIG. 3 illustrates a device for determining an impedance of the battery pack of FIG. 1A or FIG. 2A according to embodiments described herein.

FIG. 3 illustrates a device 300 that includes a controller. In the embodiment illustrated in FIG. 3, the device is a power tool (e.g., a drill/driver). In other embodiments, the device 300 is a different type of power tool (e.g., an impact wrench, a ratchet, a saw, a hammer drill, an impact driver, a rotary hammer, a grinder, a blower, a trimmer, etc.) or a different type of device (e.g., a light, a non-motorized sensing tool, etc.). The device 300 includes a housing 305 and an interface portion 310 for connecting the device 300 to, for example, the battery pack 100, 200.

Figure 4:
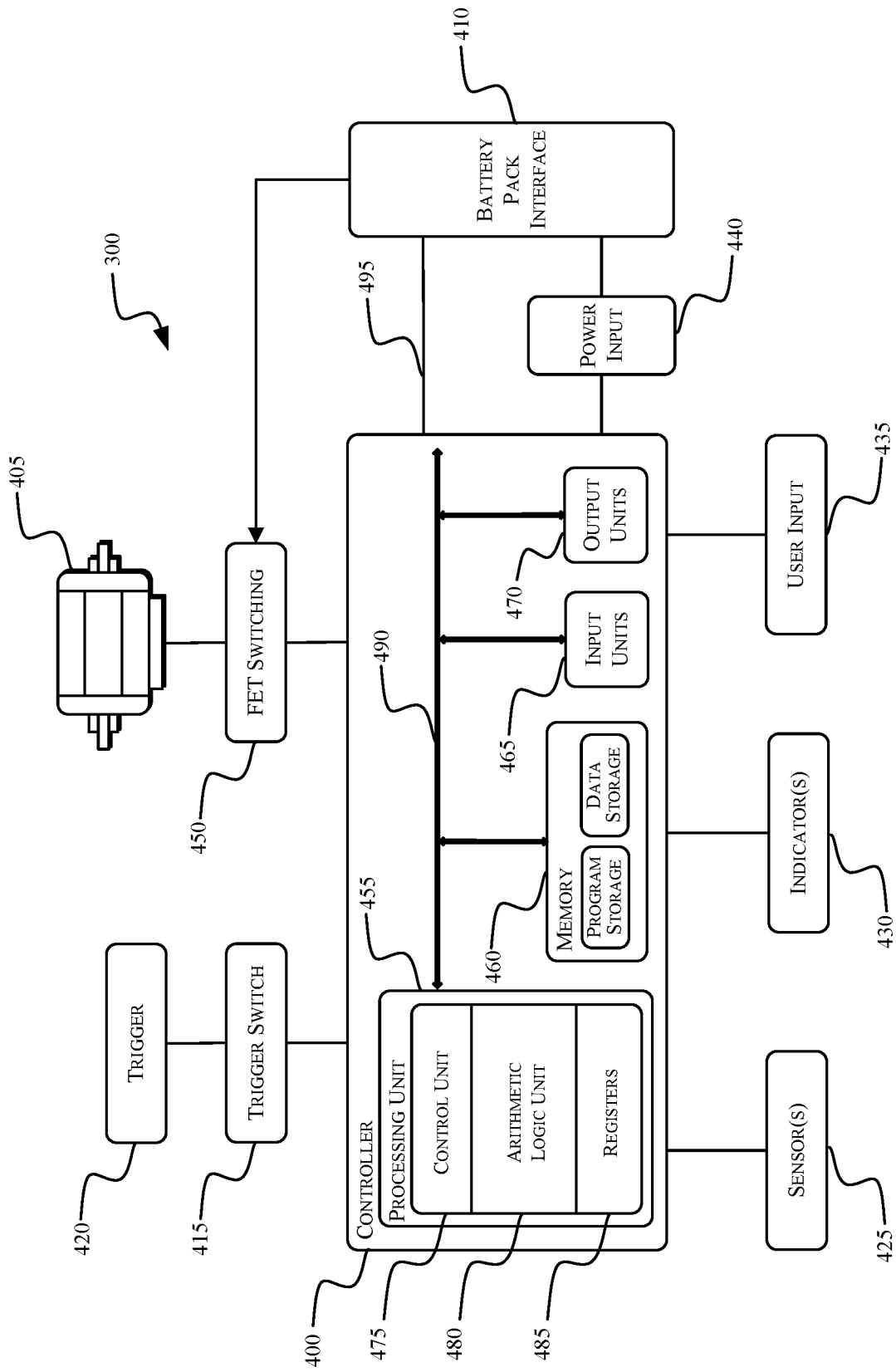
FIG. 4 illustrates a control system for the device of FIG. 3 according to embodiments described herein.

FIG. 4 illustrates a control system for the device 300. The control system includes a controller 400. The controller 400 is electrically and/or communicatively connected to a variety of modules or components of the device 300. For example, the illustrated controller 400 is electrically connected to a motor 405, a battery pack interface 410, a trigger switch 415 (connected to a trigger 420), one or more sensors or sensing circuits 425, one or more indicators 430, a user input module 435, a power input module 440, and a FET switching module 450 (e.g., including a plurality of switching FETs). The controller 400 includes combinations of hardware and software that are operable to, among other things, control the operation of the device 300, monitor the operation of the device 300, activate the one or more indicators 430 (e.g., an LED), etc.

The controller 400 includes a plurality of electrical and electronic components that provide power, operational control, and protection to the components and modules within the controller 400 and/or the device 300. For example, the controller 400 includes, among other things, a processing unit 455 (e.g., a microprocessor, a microcontroller, an electronic processor, an electronic controller, or another suitable programmable device), a memory 460, input units 465, and output units 470. The processing unit 455 includes, among other things, a control unit 475, an ALU 480, and a plurality of registers 485 (shown as a group of registers in FIG. 4), and is implemented using a known computer architecture (e.g., a modified Harvard architecture, a von Neumann architecture, etc.). The processing unit 455, the memory 460, the input units 465, and the output units 470, as well as the various modules or circuits connected to the controller 400 are connected by one or more control and/or data buses (e.g., common bus 490). The control and/or data buses are shown generally in FIG. 4 for illustrative purposes. The use of one or more control and/or data buses for the interconnection between and communication among the various modules, circuits, and components would be known to a person skilled in the art in view of the invention described herein.

The memory 460 is a non-transitory computer readable medium and includes, for example, a program storage area and a data storage area. The program storage area and the data storage area can include combinations of different types of memory, such as a ROM, a RAM (e.g., DRAM, SDRAM, etc.), EEPROM, flash memory, a hard disk, an SD card, or other suitable magnetic, optical, physical, or electronic memory devices. The processing unit 455 is connected to the memory 460 and executes software instructions that are capable of being stored in a RAM of the memory 460 (e.g., during execution), a ROM of the memory 460 (e.g., on a generally permanent basis), or another non-transitory computer readable medium such as another memory or a disc. Software included in the implementation of the device 300 can be stored in the memory 460 of the controller 400. The software includes, for example, firmware, one or more applications, program data, filters, rules, one or more program modules, and other executable instructions. The controller 400 is configured to retrieve from the memory 460 and execute, among other things, instructions related to the control processes and methods described herein. In other constructions, the controller 400 includes additional, fewer, or different components.

The battery pack interface 410 includes a combination of mechanical components (e.g., rails, grooves, latches, etc.) and electrical components (e.g., one or more terminals) configured to and operable for interfacing (e.g., mechanically, electrically, and communicatively connecting) the device 300 with a battery pack (e.g., the battery pack 100). For example, power provided by the battery pack 100 to the device 300 is provided through the battery pack interface 410 to the power input module 440. The power input module 440 includes combinations of active and passive components to regulate or control the power received from the battery pack 100 prior to power being provided to the controller 400. The battery pack interface 410 also supplies power to the FET switching module 450 to provide power to the motor 405. The battery pack interface 410 also includes, for example, a communication line 495 for provided a communication line or link between the controller 400 and the battery pack 100.

The indicators 430 include, for example, one or more light-emitting diodes ("LEDs"). The indicators 430 can be configured to display conditions of, or information associated with, the device 300. For example, the indicators 430 are configured to indicate measured electrical characteristics of the device 300, the status of the device 300, etc. The user input module 435 is operably coupled to the controller 400 to, for example, select a forward mode of operation or a reverse mode of operation, a torque and/or speed setting for the device 300 (e.g., using torque and/or speed switches), etc. In some embodiments, the user input module 435 includes a combination of digital and analog input or output devices required to achieve a desired level of operation for the device 300, such as one or more knobs, one or more dials, one or more switches, one or more buttons, etc.

The controller 400 is configured to determine whether a fault condition of the device 300 is present and generate one or more control signals related to the fault condition. For example, the sensing circuits 425 include one or more current sensors, one or more speed sensors, one or more Hall Effect sensors, one or more temperature sensors, etc. The controller 400 calculates or includes, within memory 460, predetermined operational threshold values and limits for operation of the device 300. For example, when a potential thermal failure (e.g., of a FET, the motor 405, etc.) is detected or predicted by the controller 400, power to the motor 405 can be limited or interrupted until the potential for thermal failure is reduced. If the controller 400 detects one or more such fault conditions of the device 300 or determines that a fault condition of the device 300 no longer exists, the controller 400 is configured to provide information and/or control signals to another component of the battery pack 100 (e.g. the battery pack interface 410, the indicators 430, etc.).

Figure 5:
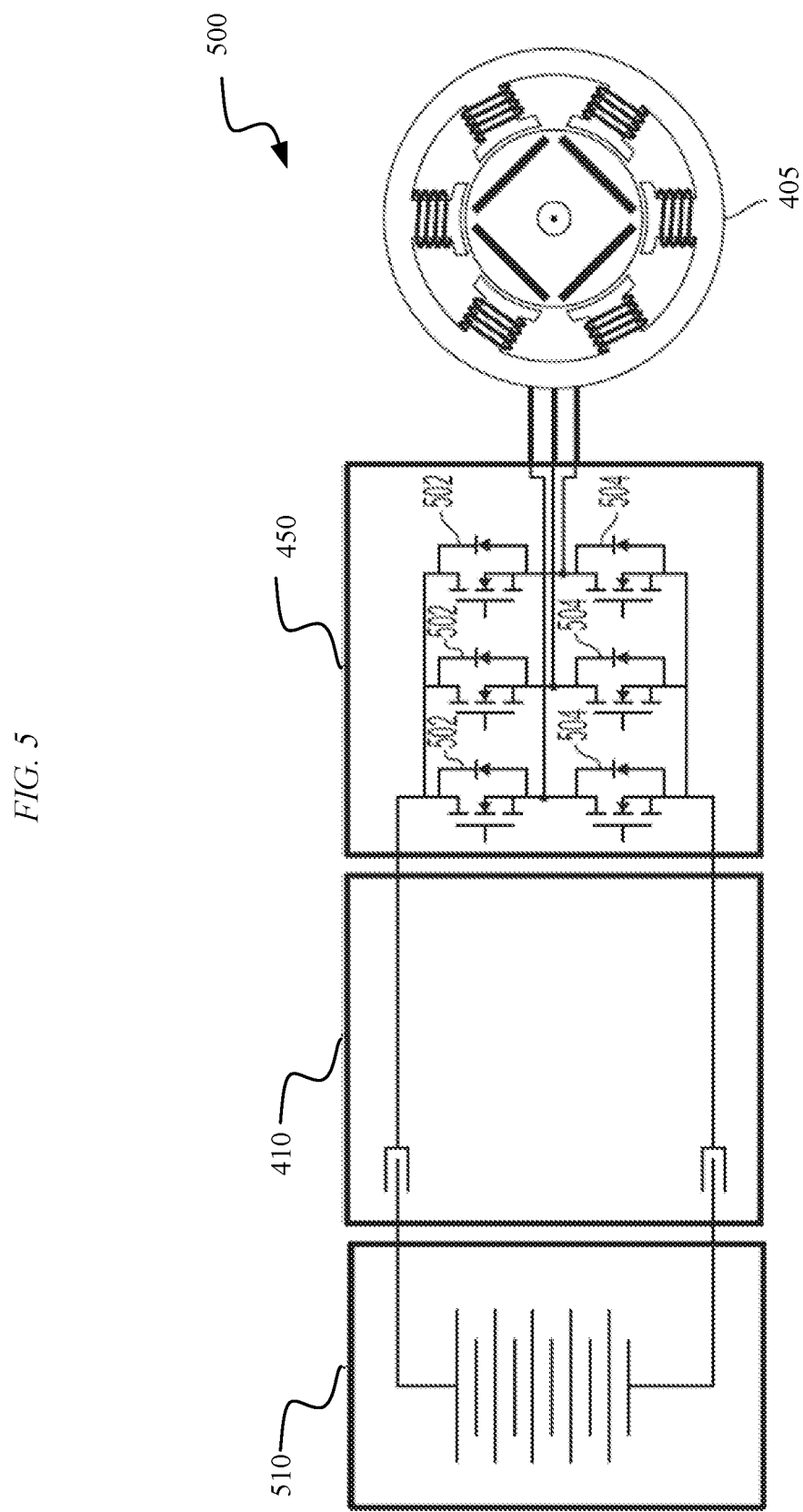
FIG. 5 illustrates a circuit diagram for a FET switching module according to embodiments described herein.

FIG. 5 illustrates a circuit diagram 500 of the FET switching module 450. The FET switching module 450 includes a number of high side power switching elements 502 and a number of low side power switching elements 504. The controller 400 provides the control signals to control the high side FETs 502 and the low side FETs 504 to drive the motor 405 based on the motor feedback information and user controls, as described above. For example, in response to detecting a pull of the trigger 420, the controller 400 provides the control signals to selectively enable and disable the FETs 502 and 504 (e.g., sequentially, in pairs) resulting in power from the power source 510 (e.g., battery pack 100, 200) to be selectively applied to stator coils of the motor 405 to cause rotation of a rotor. More particularly, to drive the motor 405, the controller 400 enables a first high side FET 502 and first low side FET 504 pair (e.g., by providing a voltage at a gate terminal of the FETs) for a first period of time. In response to determining that the rotor of the motor 405 has rotated based on a pulse from the sensing circuits 425, the controller 400 disables the first FET pair, and enables a second high side FET 502 and a second low side FET 504. In response to determining that the rotor of the motor 405 has rotated based on pulse(s) from the sensing circuits 425, the controller 400 disables the second FET pair, and enables a third high side FET 502 and a third low side FET 504. This sequence of cyclically enabling pairs of high side FET 502 and low side FET 504 repeats to drive the motor 405. Further, in some embodiments, the control signals include pulse width modulated (PWM) signals having a duty cycle that is set in proportion to the amount of trigger pull of the trigger 420, to thereby control the speed or torque of the motor 405.

Figure 6A:
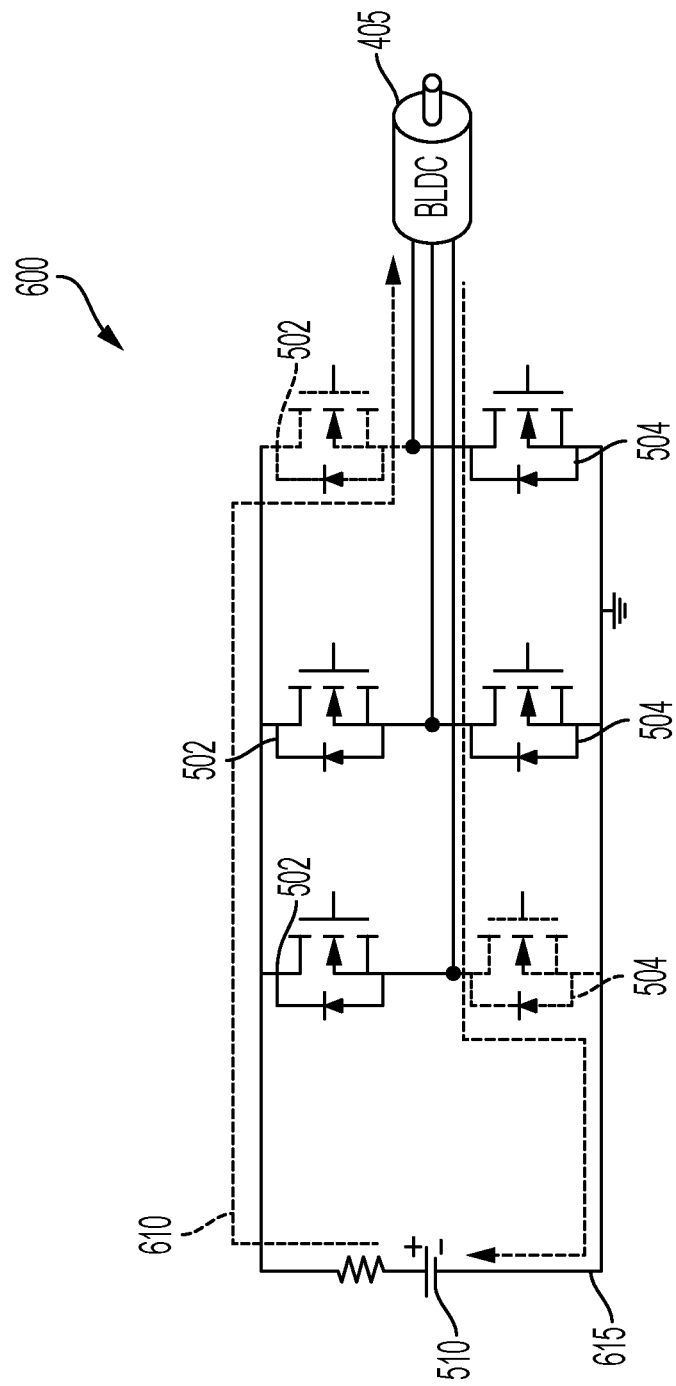
FIGS. 6A, 6B, 6C, and 6D illustrate circuit diagrams to demonstrate current flow in the circuit diagram of FIG. 5 according to embodiments described herein.

FIG. 6A illustrates a current flow diagram 600 of the FET switching module 450 for using current to determine battery pack impedance. The FET switching module 450 includes the plurality of high side power switching elements 502 and the plurality of low side power switching elements 504, as described above. For example, in response to detecting a pull of the trigger 420, the controller 400 provides the control signals to selectively enable and disable the FETs 502 and 504 (e.g., sequentially, in pairs) resulting in power being provided from the power source 510 (e.g., battery pack 100, 200). Current 610 travels from the power source 510 through one of the high side power switching elements 502 to stator coils of the motor 405. The current 610 then travels from the motor 405 to one of the low side power switching elements 504 before completing a path of connection 615 of the power source 510.

Figure 6B:
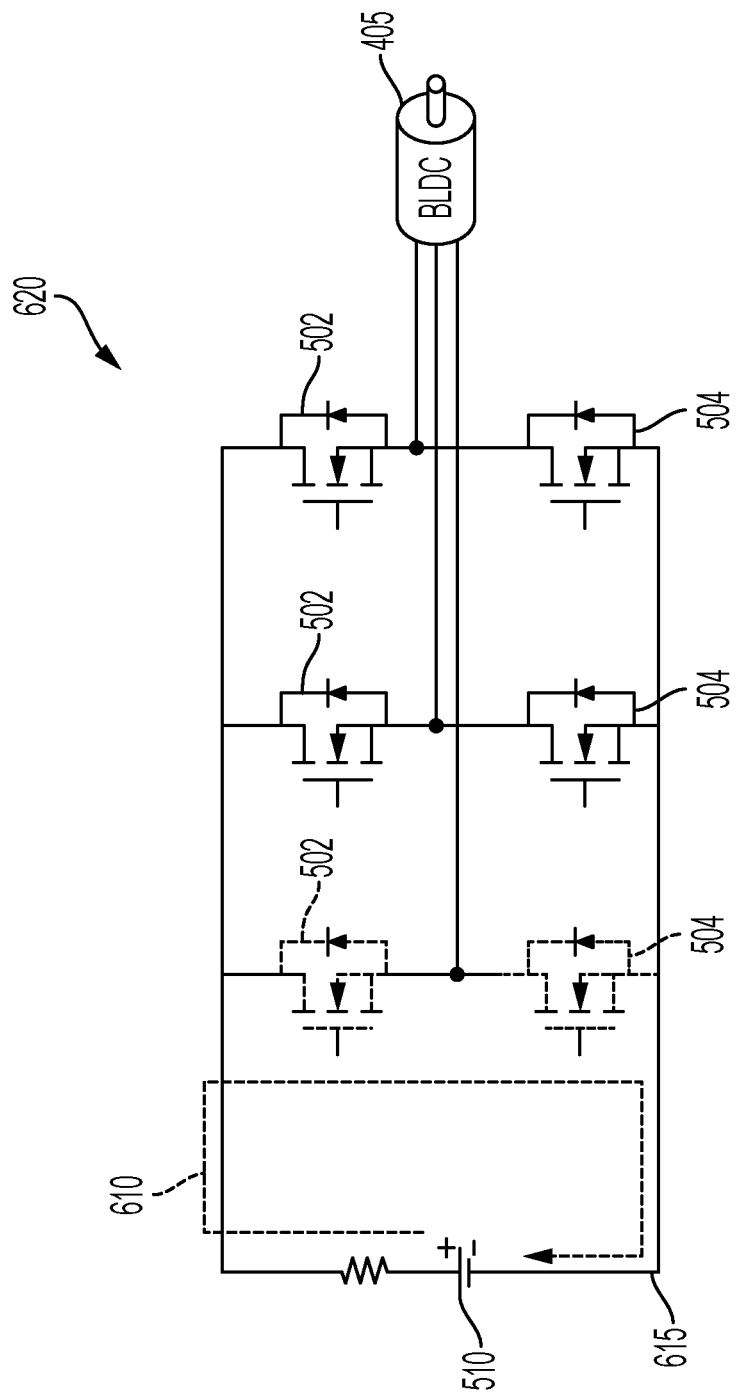

FIG. 6B illustrates another embodiment of a current flow diagram 620 of the FET switching module 450 for using current to determine battery pack impedance. The FET switching module 450 includes the plurality of high side power switching elements 502 and the plurality of low side power switching elements 504, as described above. For example, in response to detecting a pull of the trigger 420, the controller 400 provides the control signals to selectively enable and disable the FETs 502 and 504 (e.g., sequentially, in pairs) resulting in power being provided from the power source 510 (e.g., battery pack 100, 200). Current 610 travels from the power source 510 through one high side power switching elements 502, to one low side power switching elements 504. The current 610 closes the circuit by then returning to the power source 510. This reduced current 610 path only travels through two switching FETs and completes a shorter portion of the path of connection 615 of the power source 510. In some embodiments, one or more high side power switching elements 502 and/or one or more low side power switching elements 504 are enabled at the same time. Such control may decrease the overall resistance of the system and enable higher current flow and distributing the load of the system through the FETs 502 and 504 to reduce FET 502 and 504 burnup.

Figure 6C:
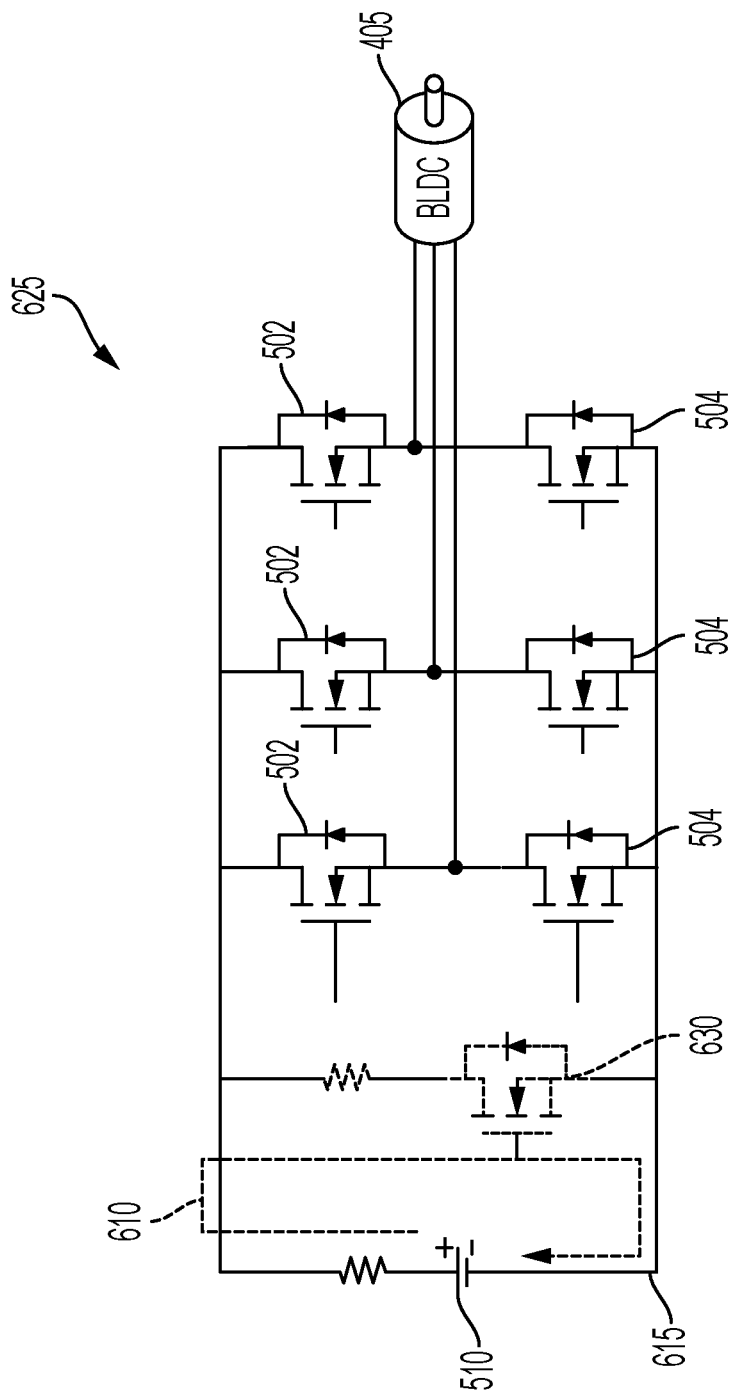

FIG. 6C illustrates another embodiment of a current flow diagram 625 of the FET switching module 450 for using current to determine battery pack impedance. In this embodiment, an additional switching module 630 is connected to the path of connection 615. In addition to the additional switching module 630, an additional resistor is connected to the path of connection 615. For example, in response to detecting a pull of the trigger 420, the controller 400 provides the control signals to selectively enable and disable the switching module 630 resulting in power being provided from the power source 510 (e.g., battery pack 100, 200). Current 610 travels from the power source 510 through the additional resistor, then through the additional switching module 630. The current 610 only travels through the additional resistor and the additional switching module 630 then returns to the power source 510 to close the circuit. In other embodiments, an inductor can be used for similar purposes as the additional resistor. Additionally, other circuitry configurations may be configured in such a way that other components can be used (e.g., a capacitor).

Figure 6D:
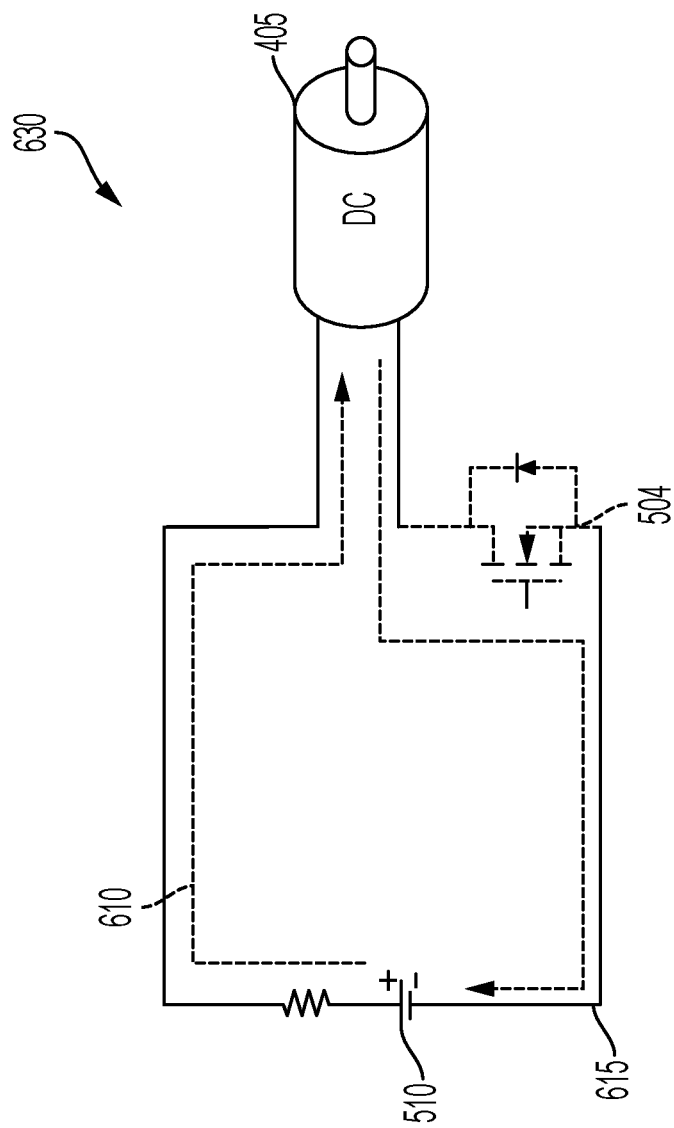

FIG. 6D illustrates yet another embodiment of a current flow diagram 630 of the FET switching module 450 for using current to determine battery pack impedance. In this embodiment, only one power switching module 504 is used. For example, in response to detecting a pull of the trigger 420, the controller 400 provides the control signals to selectively enable and disable the power switching element 504 resulting in power being provided from the power source 510 (e.g., battery pack 100, 200). Current 610 travels from the power source 510 to the motor 405 (e.g., a brushed motor), then to the power switching element 504 before closing the path of connection 615.

Figure 7A:
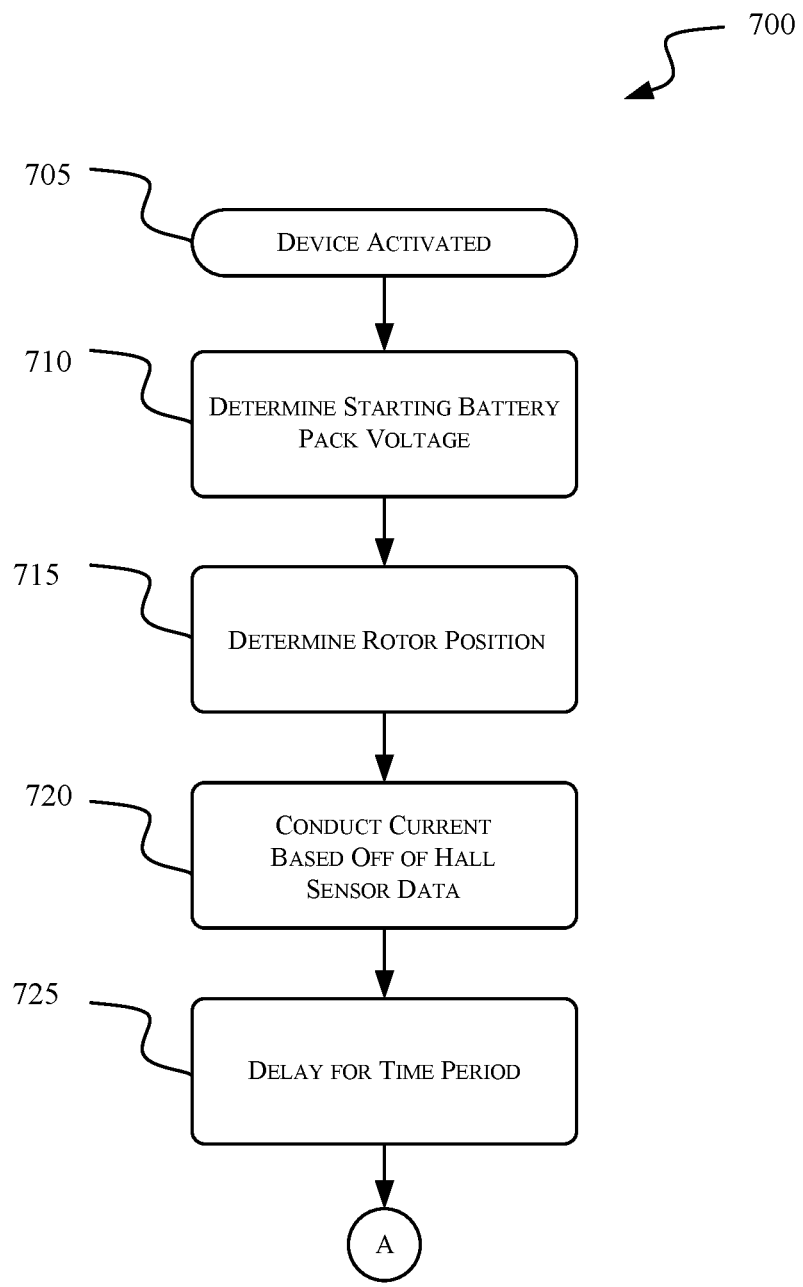
FIGS. 7A, 7B, and 7C illustrate a process for determining impedance of a battery pack according to embodiments described herein.

FIG. 7A illustrates a method 700 executed by the controller 400 of the device 300. The device 300 is activated (STEP 705) to initialize the method 700 by the controller 400. For example, the device 300 may be activated by detecting a pull of the trigger 420, which causes the battery pack to deliver power to the device 300. The controller 400 receives or measures the battery pack 100, 200 voltage from the battery pack 100, 200, and the controller 400 determines or calculates a starting battery pack voltage (STEP 710). The device 300 then one or more signals from the plurality of sensing circuits 425 (e.g., Hall Effect sensors) related to a rotational position of the motor 405 (i.e., the rotor). Data corresponding to the one or more signals are stored within the memory 460 for determining rotor position (STEP 715). In some embodiments, the power tool does not include Hall Effect sensors. Instead, the power tool uses back-emf to determine the position of the motor. In other embodiments, an inrush technique by enabling the high side switching elements 502 and the low side switching elements 504 can derive the position of the motor (e.g., through back-emf, Hall transition, etc.). In other embodiments, the motor 405 position may be ascertained by conducting multiple quick inrush pulses and comparing relative impedances. In other embodiments, the position of the motor is not used in the case where the inductance is similar regardless of motor rotation.

In some embodiments, STEPS 715 and 720 may be optional. If the location of the rotor is known, the current may flow through a path with ideal inductance. Higher inductance corresponds to a slower rise in current. This allows more time for the rise in current, which helps to take the measurement. If there is a fixed time period delay (described in further detail below), it also avoids draining too much current that might damage electrical components.

Using the data received from the aforementioned sensing circuits 425, the device 300 initiates power to one or more high side power switches modules 502, and one or more low side switching modules 504, which consequently conducts current through the motor 405 (STEP 720). A delay is then instituted to allow for a flow of current through the system (STEP 725). The delay allows for the current to rise to a level that can be reliably read with sufficient resolution. Without the delay, there may not be a significant enough change in voltage or current. The length of the delay prevents burning up an electrical component (e.g., an FET 502 and 504), as well as not allowing the motor to over significantly rotate. In some embodiments, the method is delayed approximately 40 μs. In other embodiments, longer or shorter delays can be implemented to avoid transient voltage or current spikes. In some embodiments, one of a hard busy wait is used. In some embodiments, a measurement includes multiple samples (e.g., of current and voltage).

Figure 7B:
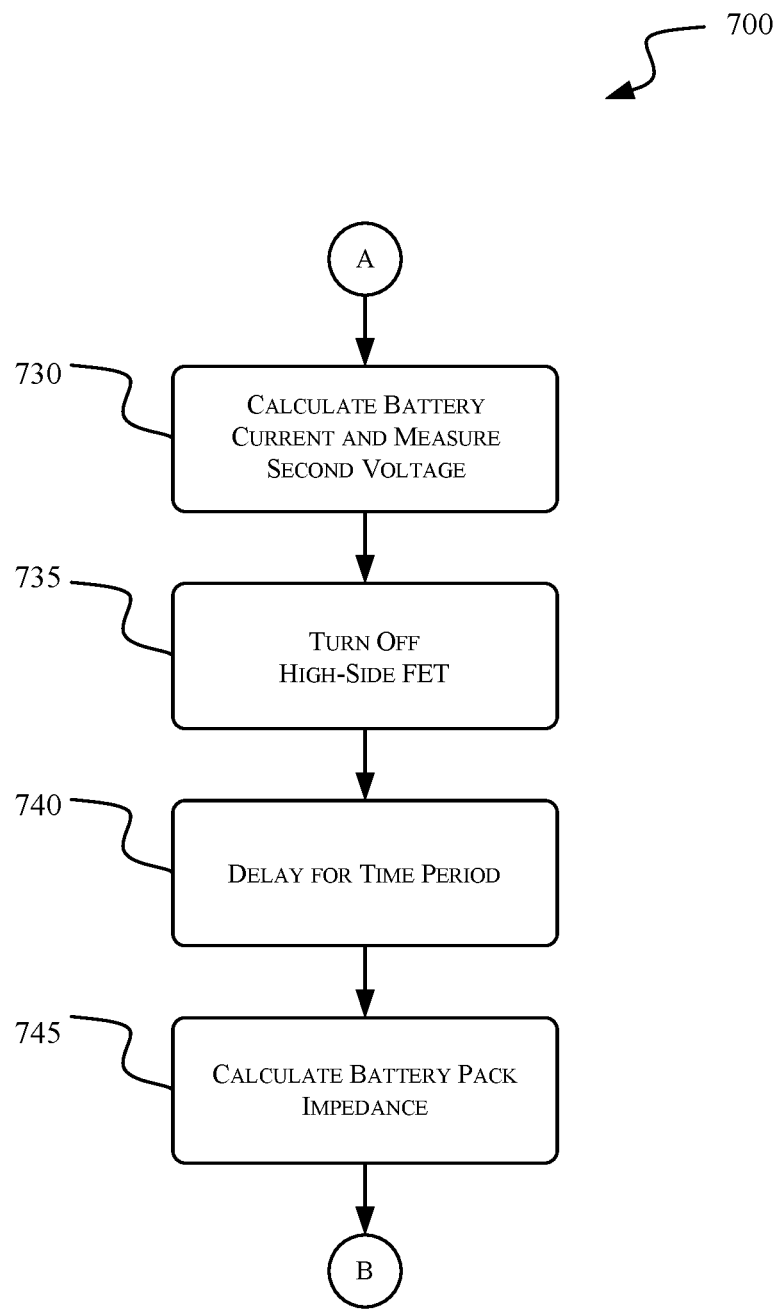

FIG. 7B illustrates a continuation of the method 700 executed by the controller 400. After implementing a delay at STEP 725, the controller 400 is configured to sample a current sense input to an analog-to-digital converter ("ADC") and receives or measures a second voltage (e.g., sampling a voltage sense input to an ADC). In some embodiments, multiple samples are taken within a measurement. The controller uses the sampled current sense input to then calculate the current of the battery pack 100, 200, $I_{bat}$, and the second voltage measurement, $V_{end}$ (STEP 730). The controller 400 is then configured to turn off the low side power switches 504 to allow the high side power switches 502 to freewheel current (STEP 735). Another delay is used to allow the high side power switches 502 to freewheel current for an amount of time (STEP 740). In some embodiments, the method is delayed approximately 100 μs. In other embodiments, longer or shorter delays can be implemented. After the second delay of the method 700, the high side power switching 502 is turned off.

Using the starting battery voltage from STEP 710, the second battery voltage from STEP 730, and the calculated current of the battery pack 100, 200 from STEP 730, the controller 400 is configured to determine the impedance of the battery pack 100, 200. The impedance of the battery pack 100, 200 can be calculated by the controller 400 using, for example, the following equation:

$$Z_{pack} = \frac{V_{start} - V_{end}}{I_{bat}} \qquad \text{EQN. 1}$$

Although EQN. 1 provides one example of how battery pack impedance can be determined, other techniques for determining battery pack impedance can also be used.

In another embodiment of estimating impedance of the battery pack, the rate of voltage drop and rate of current increase can be used in relation of the inductance of the system. The voltage drop is measured at least twice, and assumes a fixed inductance. In another embodiment of estimating impedance of the battery pack, the measurement of current alone may also be used to estimate general impedance of the battery pack. In another embodiment of estimating impedance of the battery pack, the integration of measured current over time may be used to find an estimation of the impedance of the battery pack. Similarly, the integration of voltage over time may be used to find an estimation of the impedance of the battery pack. Similarly, the derivative of the rising current and/or the derivative of the falling voltage may also be used to find an estimation of the impedance of the battery pack.

In another embodiment of estimating impedance of the battery pack, during an inrush current technique, voltage and current samples are measured to perform a slope calculation to find impedance. The slope calculation can feed into another algorithm (e.g., a neutral net, filter functions, etc.) to derive multiple aspects of the impedance (e.g., resistance, capacitance, inductive loading, etc.). Additionally, the inrush technique could be used with multiple inrush spikes and the results can be combined for a more precise output.

Figure 7C:
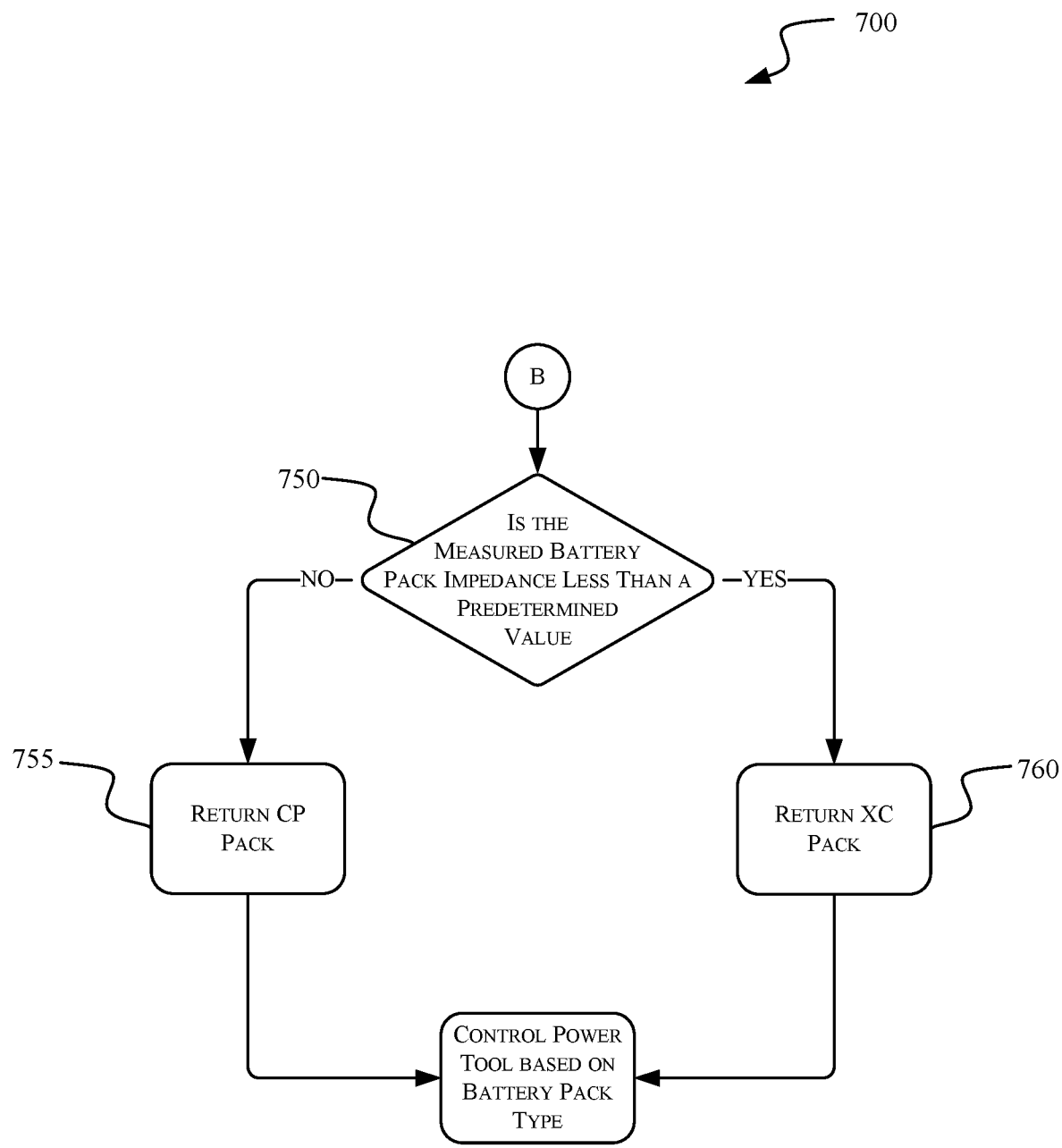

FIG. 7C is a continuation of method 700. If, at STEP 750, the calculated impedance is greater than or equal to a certain predetermined value (e.g., a value of 50 to 80 milli-Ohms), the controller 400 is configured to determine that the battery pack 100, 200 is a particular type of battery pack (STEP 755). The controller 400 then proceeds to control the device 300 (e.g., to control current drawn from the battery pack 100, 200) based on the determination of the particular type of battery pack and the calculated impedance. If, at STEP 750, the calculated impedance is less than the certain predetermined value, the controller 400 is configured to determine that the battery pack 100, 200 is a second particular type of battery pack (STEP 760). The controller 400 then proceeds to control the device 300 (e.g., to control current drawn from the battery pack 100, 200) based on the determination of the second particular type of battery pack and the calculated impedance. In other embodiments, any number of different types of battery packs can be identified (e.g., three or more, between three and 20, etc.). In some embodiments, multiple impedance thresholds are included for determining the type of battery pack. In some embodiments, the impedance is a continuous parameter that is used to identify the type of battery pack (e.g., using a lookup table). In another embodiment, the voltage and/or current of the system may be measured by the battery pack. In other embodiments, the voltage and/or current measurements may be communicated to the tool (e.g., via digital or analog interface). In other embodiments, the battery pack may self-calculate its own impedance. The battery pack may communicate the self-calculated impedance of the battery pack to the power tool. In another embodiment, the power tool may calculate the impedance of the battery pack, then communicate the result of the calculation to the battery pack.

In some embodiments, the determination of the type of the battery pack may be probabilistic. In some embodiments, the type of the battery pack may be found by a thermal measurement. The thermal measurement of the battery pack may be found using a temperature sensor (e.g., a thermistor, thermocouple, etc.). Because impedance changes with temperature, the thermal measurement can be used to identify the most probable battery pack type.

Figure 8:
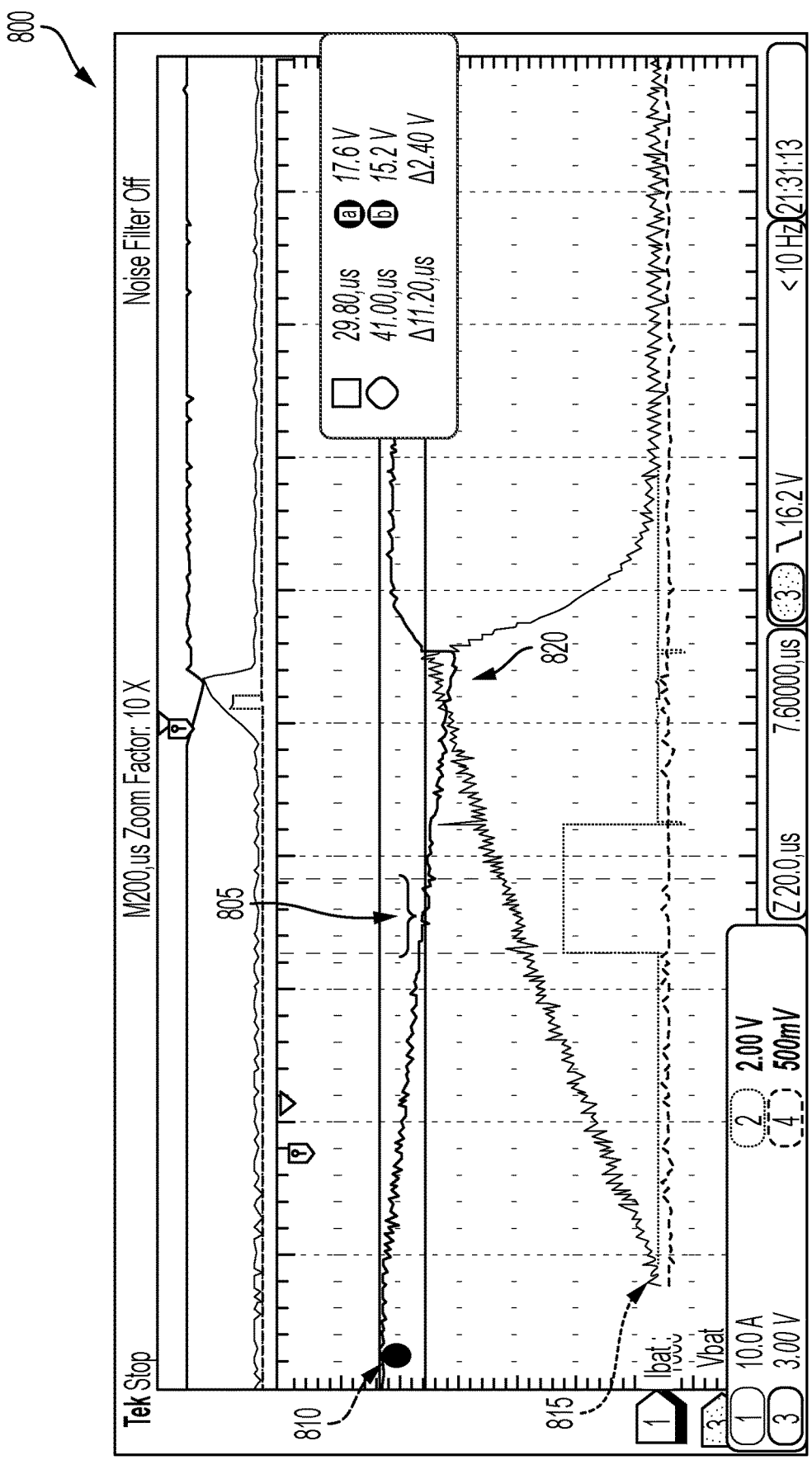
FIG. 8 is an oscilloscope screen capture illustrating the process of FIGS. 7A-7C.

FIG. 8 illustrates a screen capture 800 from an oscilloscope. The initial voltage that represents $V_{start}$ 810 shows the voltage of the battery pack 100, 200 that is later used as a variable in calculating battery pack impedance. At 815, the low side power switches 504 and the high side power switches 502 are activated and current begins to flow. The low side power switches 504 are turned off at 820 in order for the high side power switches 502 to freewheel current. The second battery voltage from STEP 730 of the method 700 is sampled at 805 and the current of the battery pack 100, 200 is measured when both FETs 502 and 504 are on. The measured voltages and current are then used in EQN. 1 to calculate battery pack impedance.

Figure 9A:
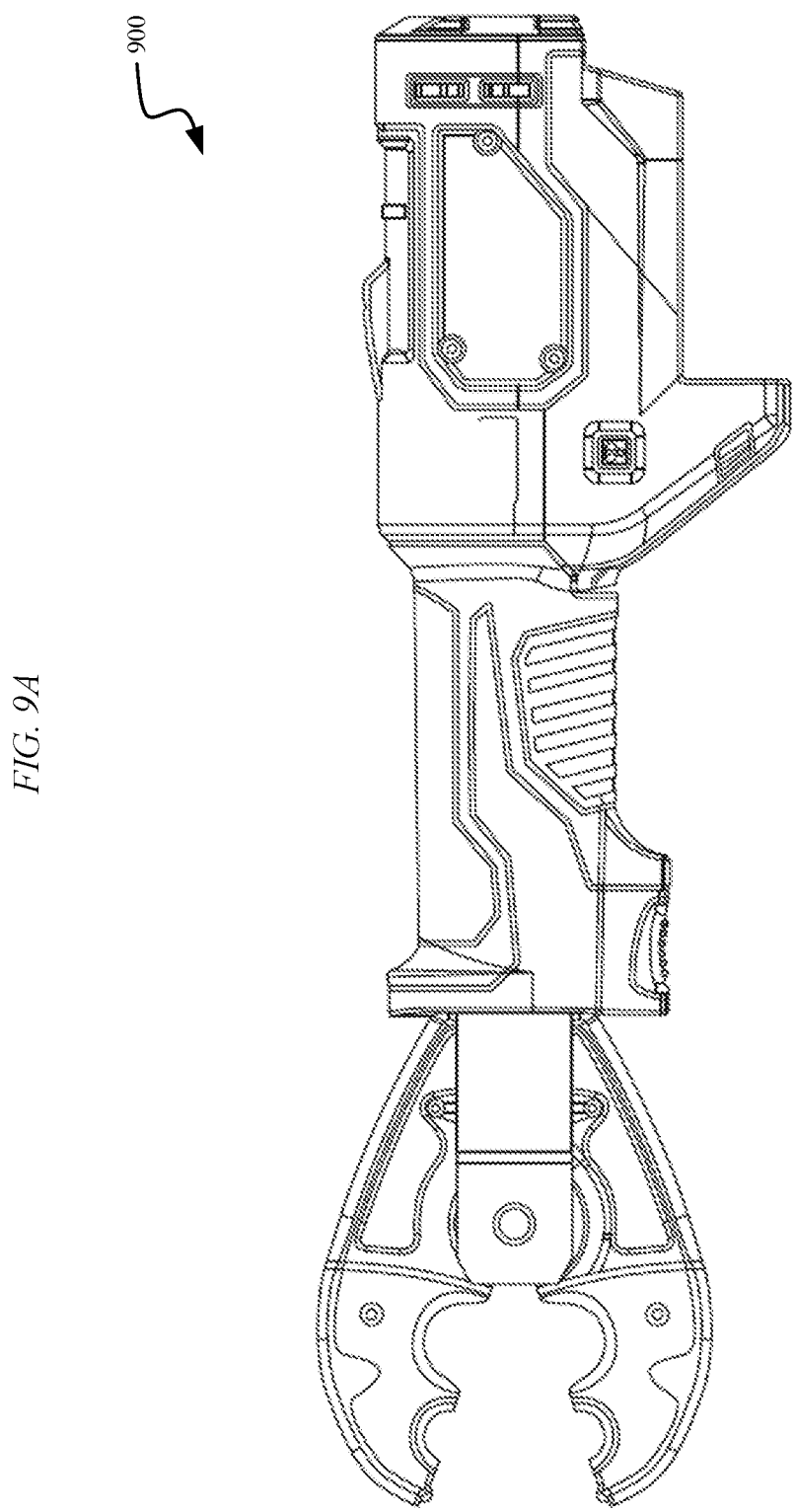
FIGS. 9A and 9B illustrate one embodiment of a device and method for determining an impedance of a battery pack attached to the device.
Figure 9B:
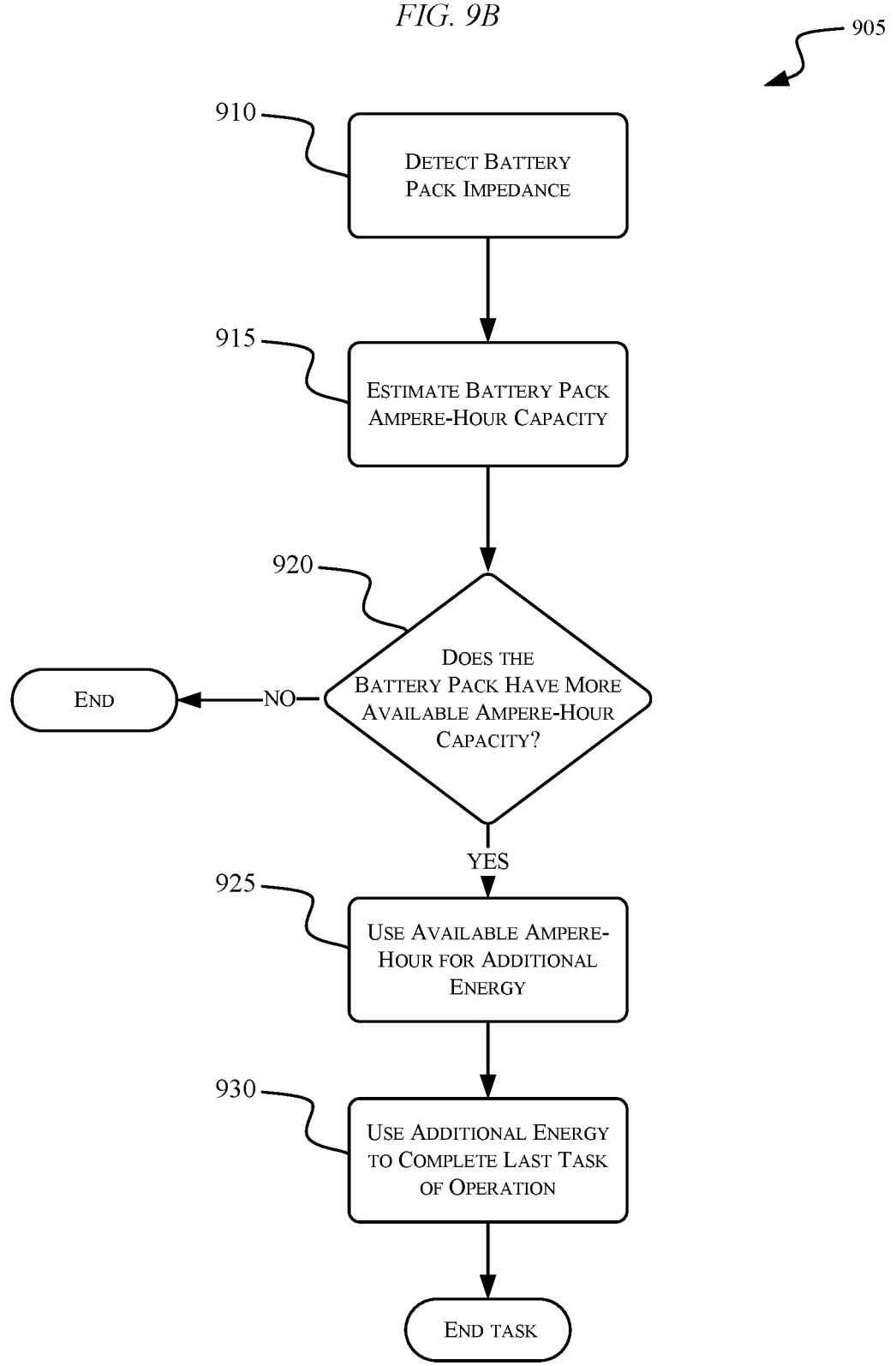

FIG. 9A illustrates one embodiment of using battery pack impedance for different uses within a multitude of devices. The device illustrated in FIG. 9A is a hydraulic crimper 900. The hydraulic crimper 900 performs work (e.g., crimping or cutting) on a workpiece. With the application of detecting battery pack impedance, the hydraulic crimper 900 utilizes battery pack impedance to perform final crimping or cutting performances. For example, FIG. 9B illustrates a method 905 using battery pack impedance. The method 905 detects the impedance of the hydraulic crimper's battery pack using one of the methods described above (STEP 910). The method 905 then uses the detected battery pack impedance to estimate the approximate battery pack Ampere-Hour capacity and uses the battery pack voltage to estimate the remaining energy of the battery pack (STEP 915). The method 905 then includes determining if the connected battery pack does not have additional Ampere-Hour capacity remaining. If there is no additional Ampere-Hour capacity remaining, the method 905 will cease (STEP 920). If additional Ampere-Hour capacity is available, that available Ampere-Hour capacity will be used for additional energy supplied to the tool, even if the battery contains a low voltage (STEP 925). The additional energy supplied to the tool will be used to complete the final task of the operation (e.g., the final crimp or cut) to finish the user's final work on a workpiece (STEP 930). The method 905 can be used for other discrete cycle power tools (e.g., knock-out punches, staplers, nailers, PVC shears, copper tubing cutters, etc.). Similarly to the hydraulic crimper 900, these tools would benefit from using the battery pack impedance to estimate the remaining Ampere-Hour capacity and determine whether to perform an application of the tool if the Ampere-Hour capacity is sufficient to complete the task.

Additionally, in other embodiments, a power tool may elect to have different soft-start procedures, application profiles, target operating points, and/or motor control based on the battery pack impedance and the battery pack voltage. This implies that the battery pack has additional energy to complete the task on a workpiece, but also will not trigger an early shutdown due to a sudden voltage drop that results in too low of a battery pack voltage. For example, the hydraulic crimper 900 recognizes that the hydraulic crimper 900 can finish the last crimp on a workpiece if the hydraulic crimper 900 slows to operate at its most efficient speed and has a gradual soft-start to avoid the battery pack voltage dropping too low with inrush currents.

Figure 10A:
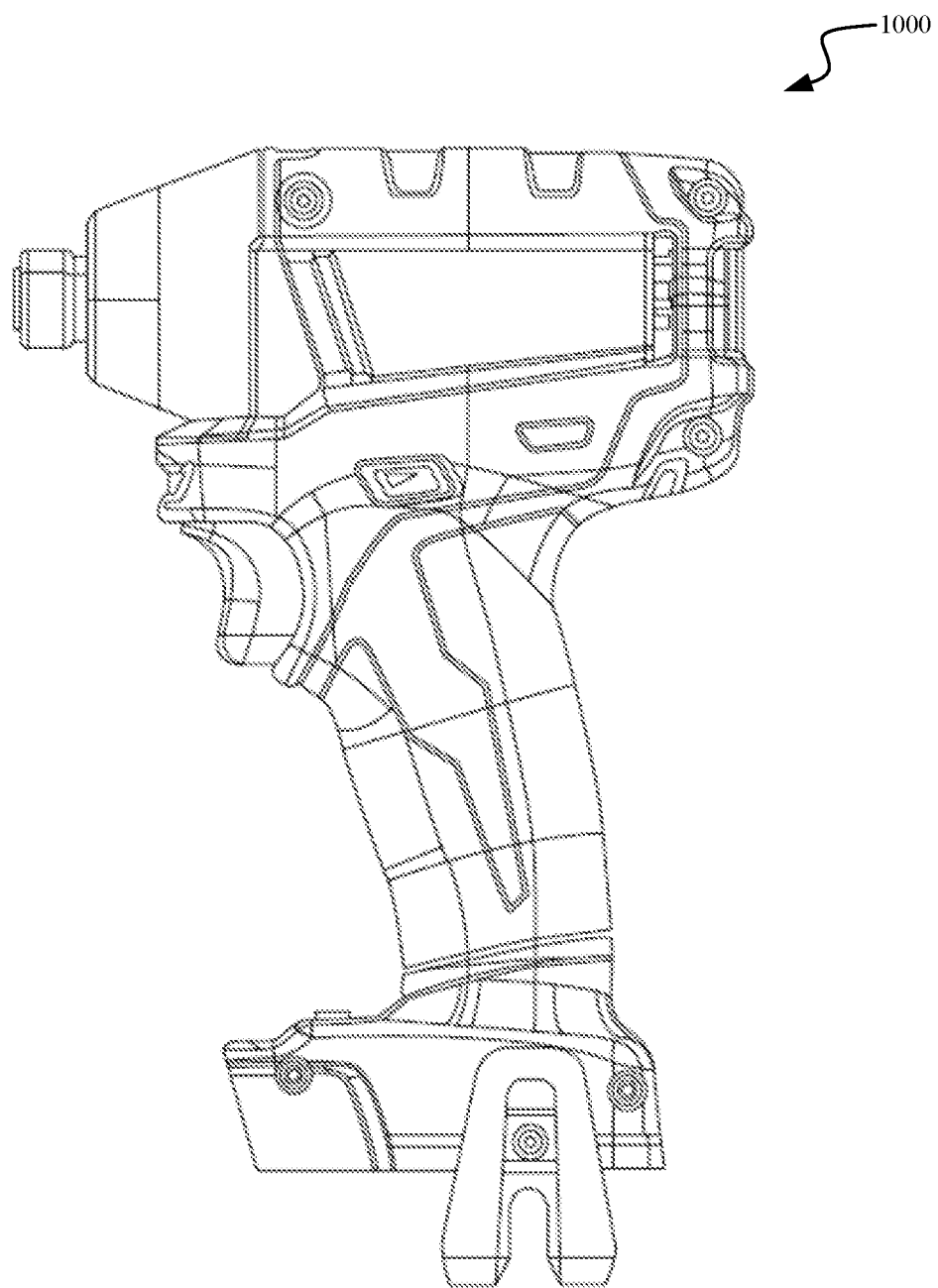
FIGS. 10A and 10B illustrate another embodiment of a device and method for determining an impedance of a battery pack attached to the device.
Figure 10B:
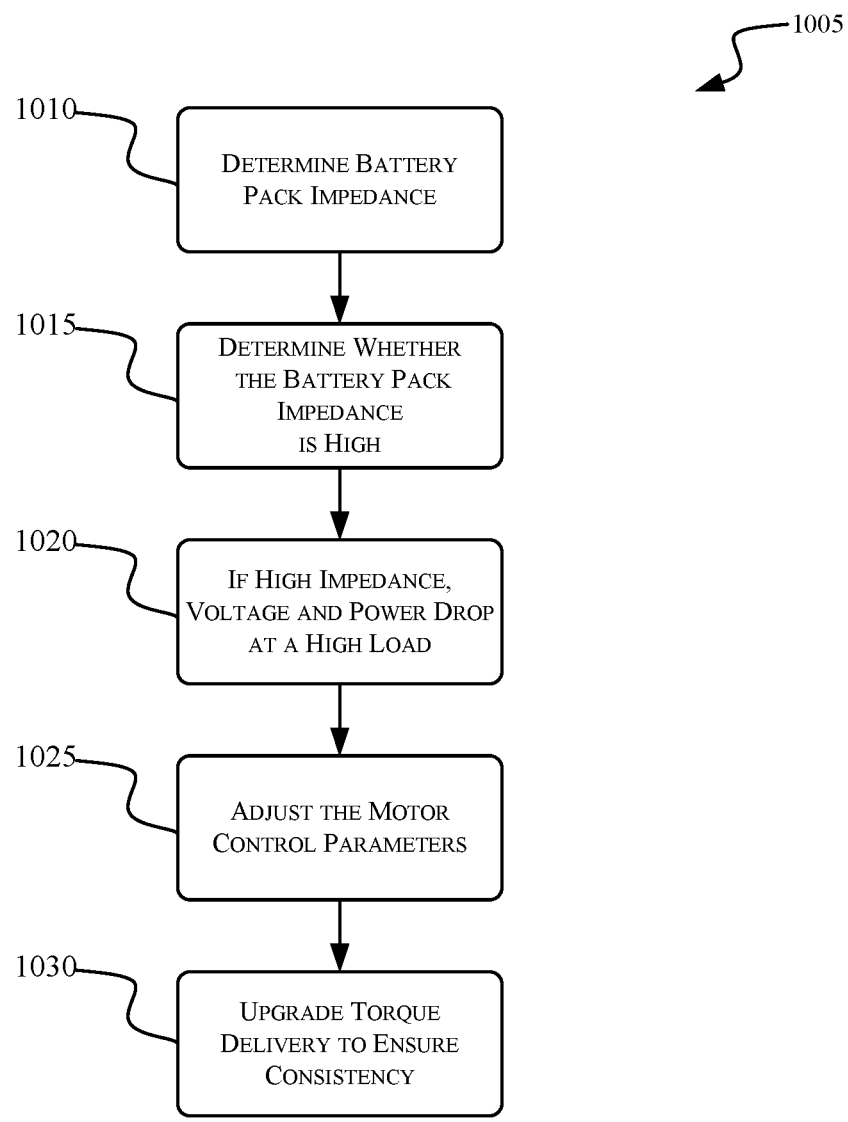

Another embodiment of using detected battery pack impedance includes impact drivers, pulse tools, drills, precision screwdrivers, powered ratchets, powered torque wrenches, etc., for precision torque control. For example, FIG. 10A illustrates an impact driver 1000. FIG. 10B illustrates a method 1005 using battery pack impedance for precision torque control. The method determines the impedance of the impact driver 1000's battery pack using one of the methods described above (STEP 1010). The method 1005 then includes determining whether the battery pack impedance is relatively high (STEP 1015). If the battery pack impedance is high, both the battery's voltage and power drop in the presence of a high load (STEP 1020). The method 1005 then includes adjusting the impact driver's 1000 motor control parameters as a result of the high battery pack impedance. The method 1005 then includes upgrading the torque delivery (e.g., increasing PWM duty cycle, changing speed control parameters, changing the number of impacts, changing a parameter of a fastening application control, etc.) by the tool to ensure a consistent performance from the impact driver 1000. The result is an improved compensation as a function of the battery pack's impedance (and, in some embodiments, a battery pack's voltage). Alternatively, the battery pack impedance may speak to the overall inertia of the combined battery pack and power tool body. This may assist with precision torque control because the combined inertia of the battery pack and power tool body is important for the motor to provide effective torque transfer to the output. The reaction inertia dictates the efficiency of the motor and can affect the timing of the impact systems. Additionally, the sensors that measure output rotation relative to the power tool body benefit from having the power tool body relatively still or its motion known. More battery inertia with a larger battery pack helps keep the tool body more still during use.

Figure 11A:
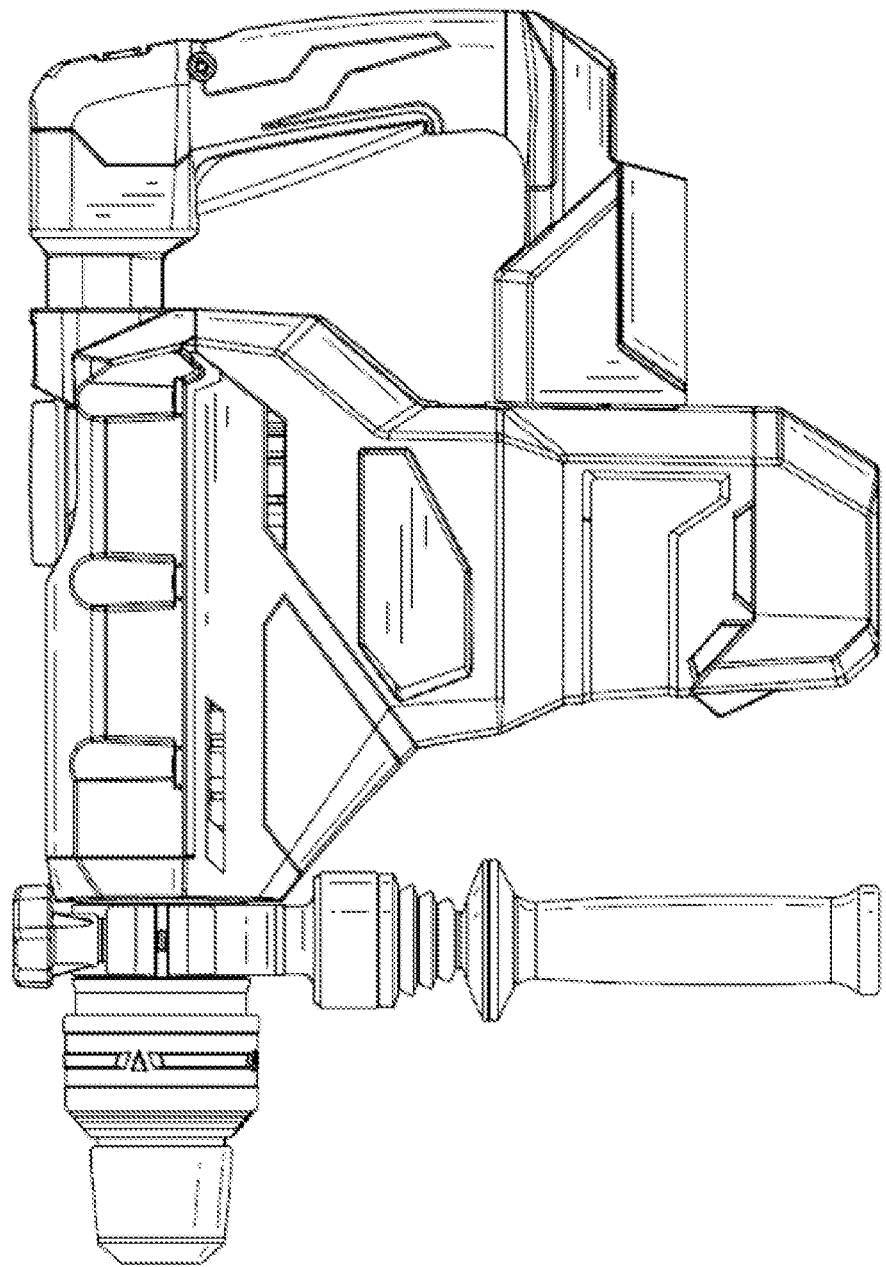
FIGS. 11A and 11B illustrate another embodiment of a device and method for determining an impedance of a battery pack attached to the device.
Figure 11B:
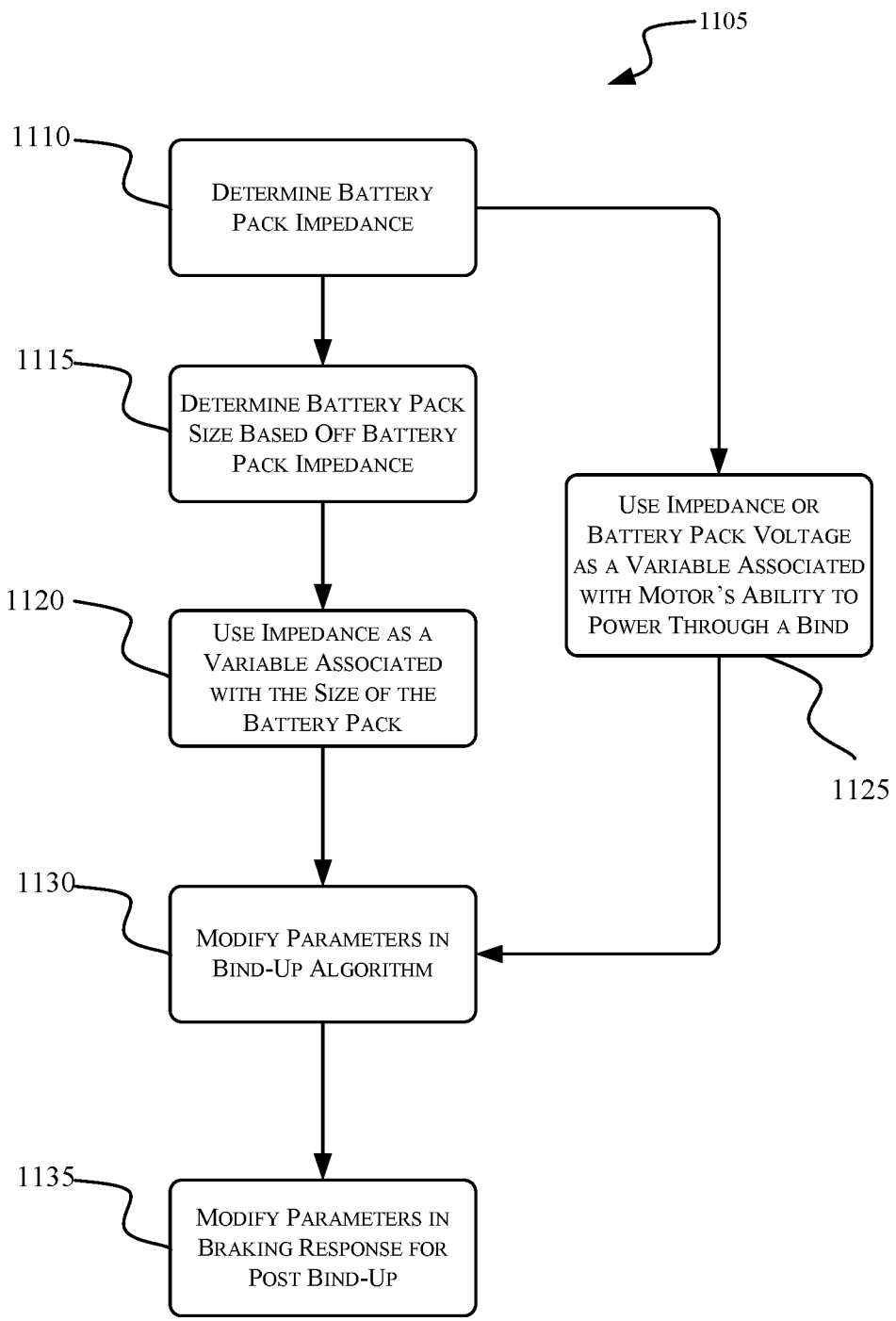

Another embodiment of using detected battery pack impedance includes drills, rotary hammer, etc., for bind-up control. For example, FIG. 11A illustrates a rotary hammer 1100. FIG. 11B illustrates a method 1105 using battery pack impedance to modify bind-up control. The method 1105 includes determining the impedance of the rotary hammer 1100's battery pack using one of the methods described above (STEP 1110). Using the impedance of the rotary hammer 1100's battery pack, the size of the battery pack attached to the rotary hammer 1100 is determined (STEP 1115). The impedance of the rotary hammer 1100's battery pack is used as a variable associated with the size and/or inertia provided by the battery pack or of the combined power tool and battery pack system (STEP 1120). Similarly, the impedance of the rotary hammer 1100's battery pack or the battery pack's voltage can be used as a variable associated with a motor's ability to power through a bind-up condition (STEP 1125). Using either or both of these sets of variables, the one or more parameters, such as amount of rotation required to detect bind up, in a bind-up algorithm can be modified (STEP 1130). Finally, the parameters in a braking response (e.g., braking force) following detection of a bind-up condition can be modified for better control and or to regulate how quickly the motor is braked (STEP 1135).

Other power tools, such as reciprocating saws, circular saws, table saws, chainsaws, etc., can also encounter bind-up conditions. These tools may be less effected by the inertia of the power tool and battery pack system, but can nonetheless benefit from the battery pack impedance as it is associated with the ability to breakthrough bind-up conditions and can affect how quickly the power tool stops.

Figure 12A:
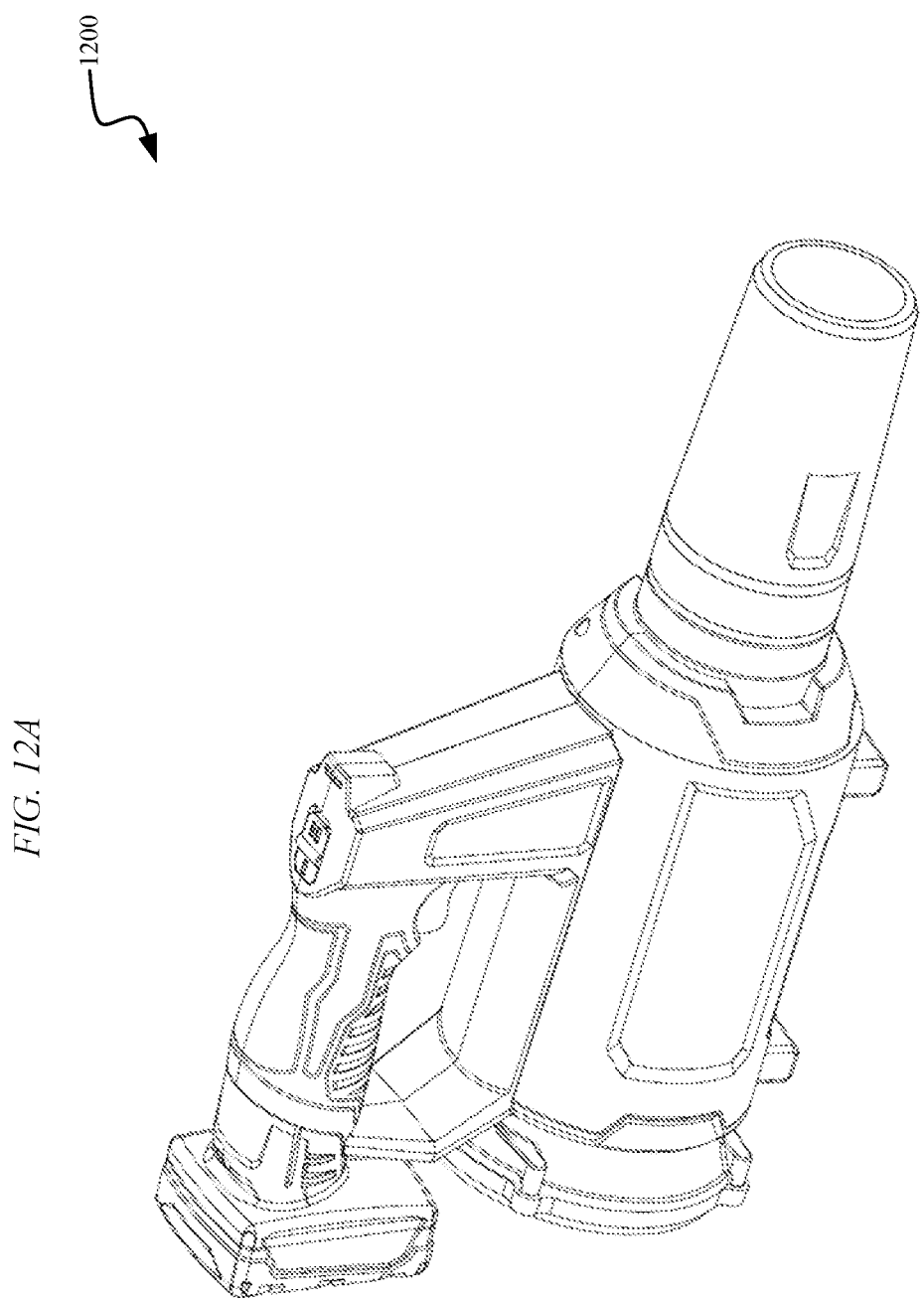
FIGS. 12A, 12B, and 12C illustrate other embodiments of devices and a method for determining an impedance of a battery pack attached to the device.
Figure 12B:
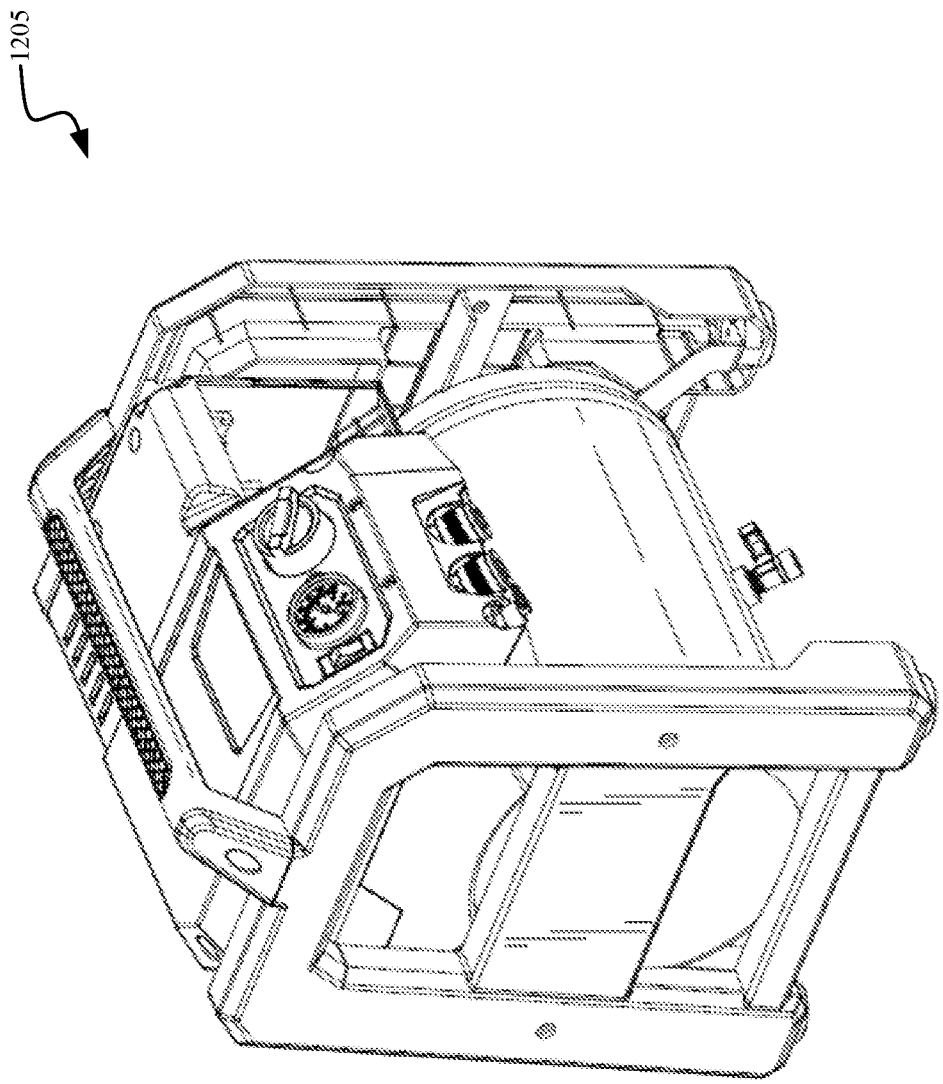
Figure 12C:
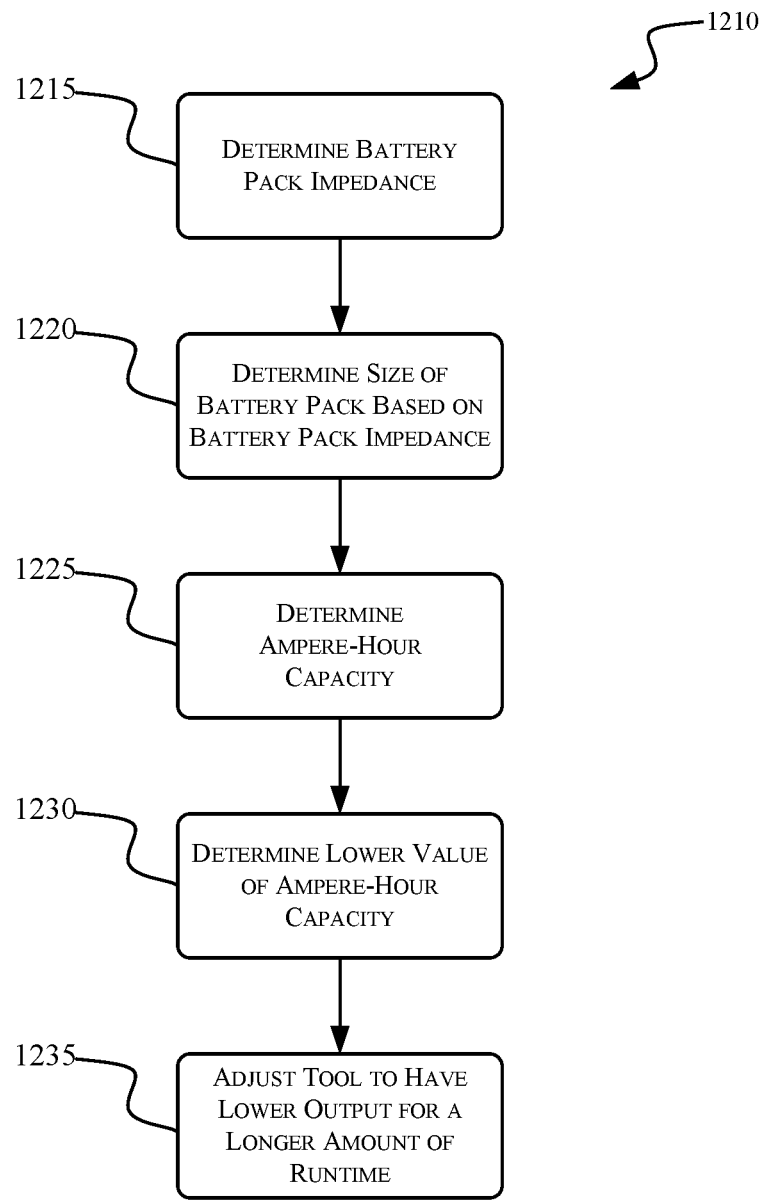

Another embodiment of using detected battery pack impedance includes vacuums, string trimmers, blowers, drills, saws, lights, power edgers, general trimmers, chainsaws, table saws, miter saws, reciprocating saws, powered sprayers, air compressors, etc., for an improved power versus runtime control. For example, FIG. 12A illustrates a blower 1200 and FIG. 12B illustrates an air compressor 1205. FIG. 12C illustrates a method 1210 using battery pack impedance to control runtime. The method 1210 includes determining impedance of the blower 1200's or the air compressor 1205's battery pack using one of the methods described above (STEP 1215). Using the battery pack impedance, the size of the battery pack can be determined (STEP 1220). The method 1210 then includes determining the Ampere-Hour capacity of the battery pack (STEP 1225) to then determine if the battery has a relatively lower value of Ampere-Hour capacity (STEP 1230). If the battery pack for either the blower 1200 or the air compressor 1205 has a low Ampere-Hour capacity, the tool will be adjusted to have a lower output (e.g., peak power, peak torque, ramp speed, max speed, etc.). The adjusted tool will have a lower output to achieve a longer amount of runtime (STEP 1235). The power tool may also factor in voltage as well as battery pack impedance in determining how much to prioritize runtime versus performance.

Figure 13A:
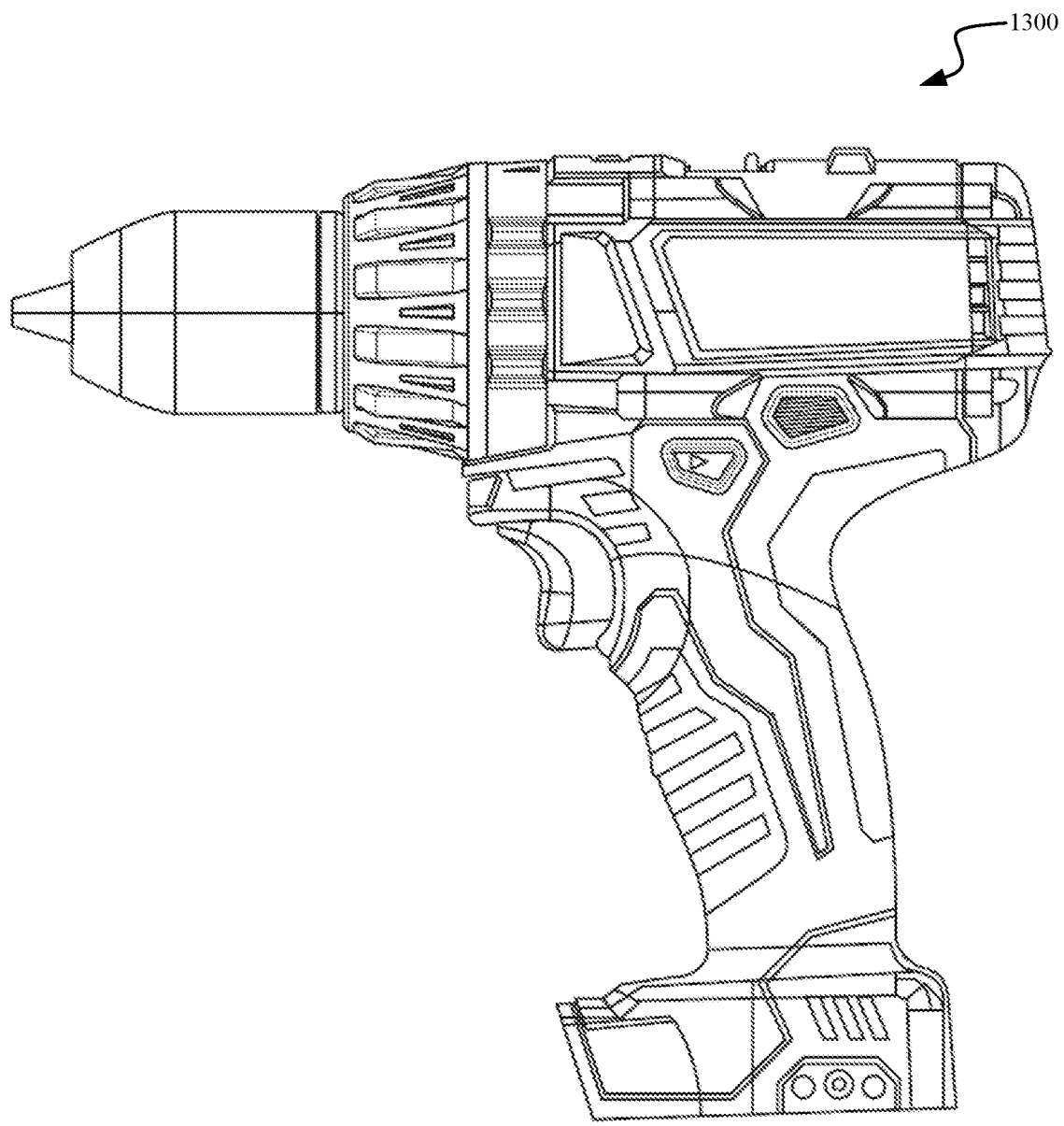
FIGS. 13A and 13B illustrate another embodiment of a device and method for determining an impedance of a battery pack attached to the device.
Figure 13B:
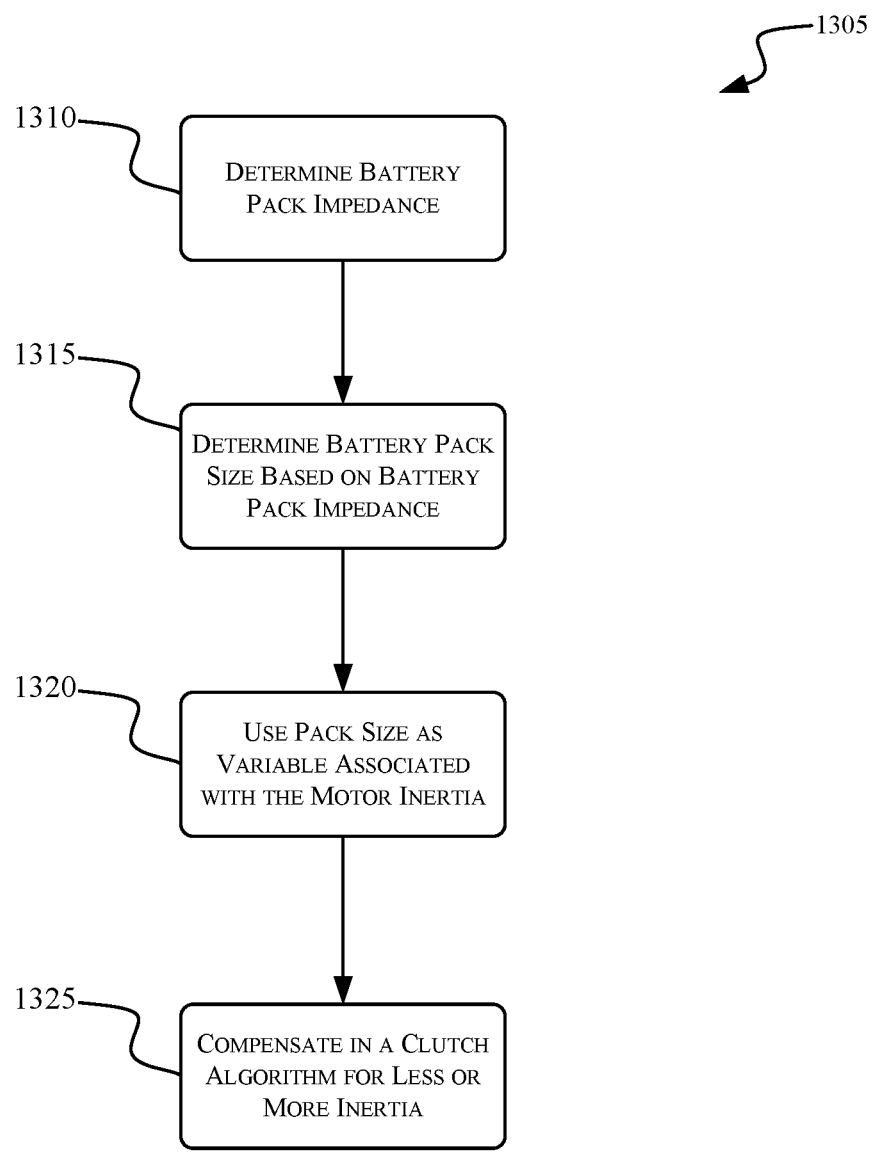

Another embodiment of using detected battery pack impedance includes drills, screwdrivers, etc., including an electronic clutch. For example, FIG. 13A illustrates a drill 1300. FIG. 13B illustrates a method 1305 using battery pack impedance to control an electronic clutch for less or more inertia from the motor or battery pack. The method 1305 includes determining the impedance of the drill 1300's battery pack using one of the methods described above (STEP 1310). Using the battery pack impedance, the size of the battery pack can be determined (STEP 1315). The size of the battery pack is then used as a variable associated with the combined inertia of a power tool and battery pack (STEP 1320). This inertia changes how much a power tool will tend to swing after a sudden output torque resistance is encountered. As such, an electronic clutch can be compensated for this extra inertia. A small battery pack suggests a small motor and, therefore, lower inertia. An electronic clutch algorithm is used to compensate for the inertia of the power tool and battery pack (e.g., adjust the threshold at which the electronic clutch is engaged) (STEP 1325).

Figure 14:
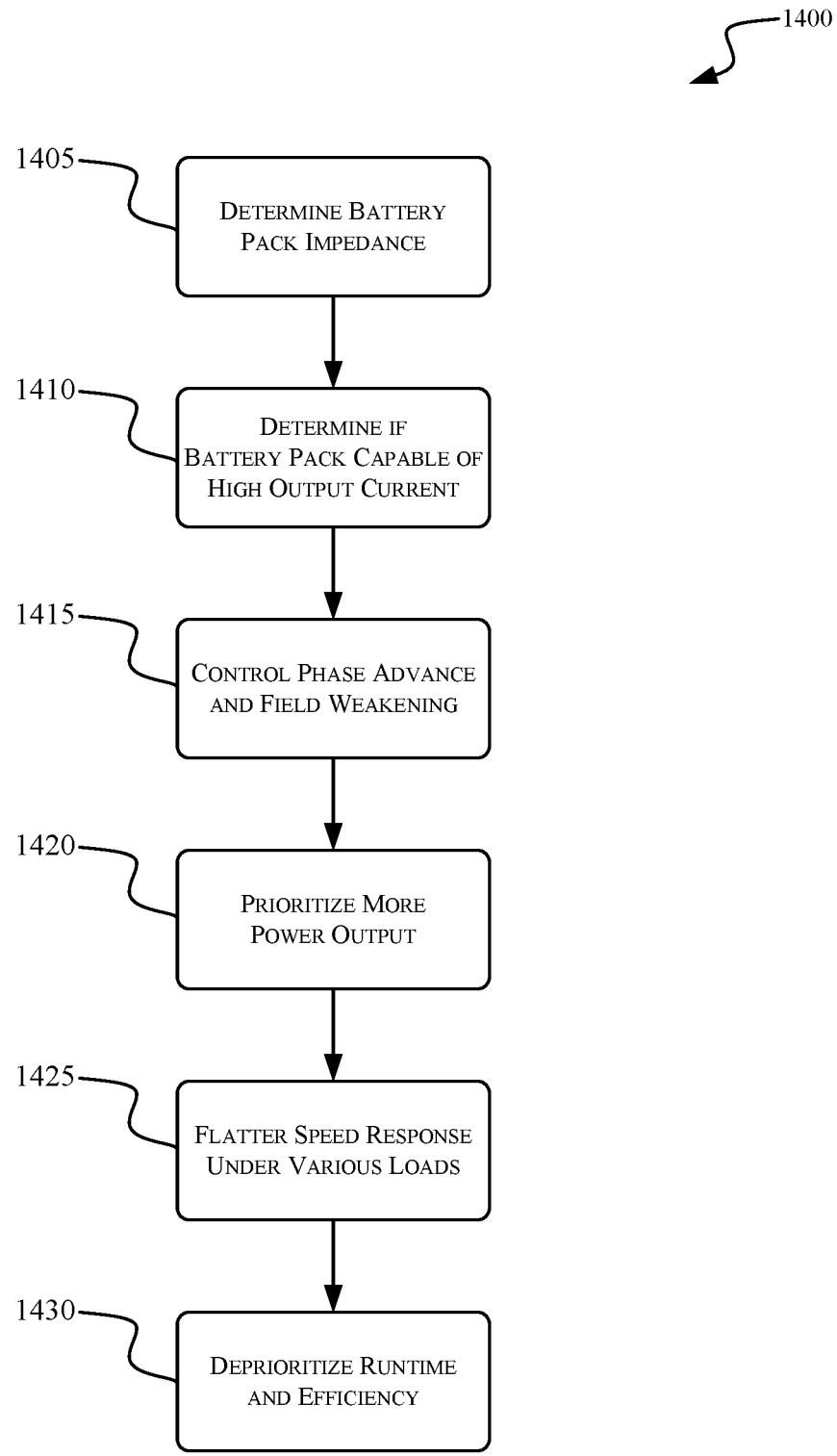
FIG. 14 illustrates a method for determining an impedance of a battery pack.

Another embodiment of using the detected impedance includes drills, saws, etc., for phase advancing and field weakening. For example, FIG. 14 illustrates a method for the embodiment of the drill 1300 shown in FIG. 13A to use battery pack impedance to control phase advancing and field weakening. The method 1400 includes determining the impedance of the drill 1300's battery pack using one of the methods described above (STEP 1405). Using the battery pack impedance, the size of the battery pack can be determined. The method 1400 then includes determining whether the attached battery pack is considered a large battery pack (e.g., higher Ampere-Hour capacity, lower impedance chemistry) (STEP 1410). If the battery pack attached to the drill 1300 is determined to be capable of high output currents the method 1400 then includes changing the control for the phase advance and field weakening of the drill (STEP 1415). Higher power output is prioritized when controlling the phase advance and field weakening (STEP 1420). Additionally or alternatively, flatter speed responses are achieved across various loads (STEP 1425), and runtime and efficiency can be deprioritized when controlling the phase advance and field weakening (STEP 1430).

Figure 15A:
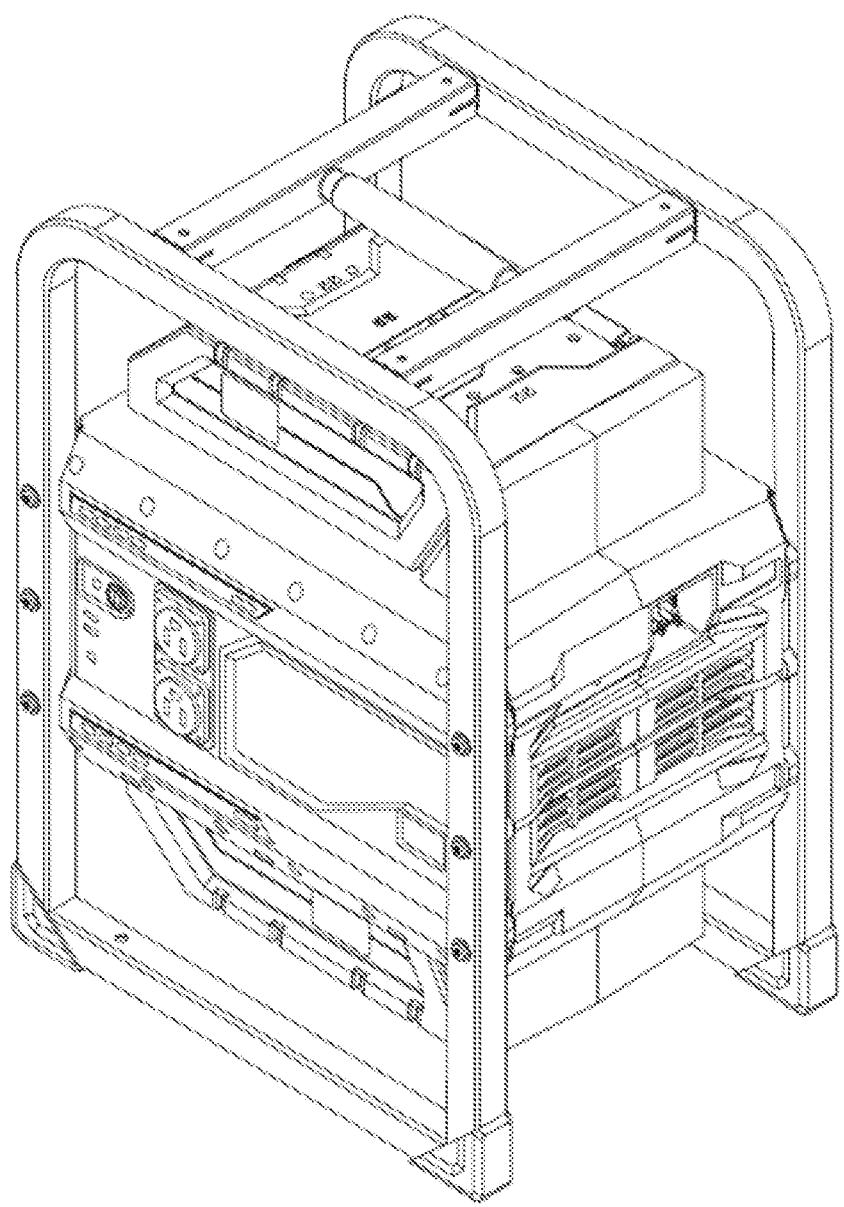
FIGS. 15A and 15B illustrate another embodiment of a device and method for determining an impedance of a battery pack attached to the device.
Figure 15B:
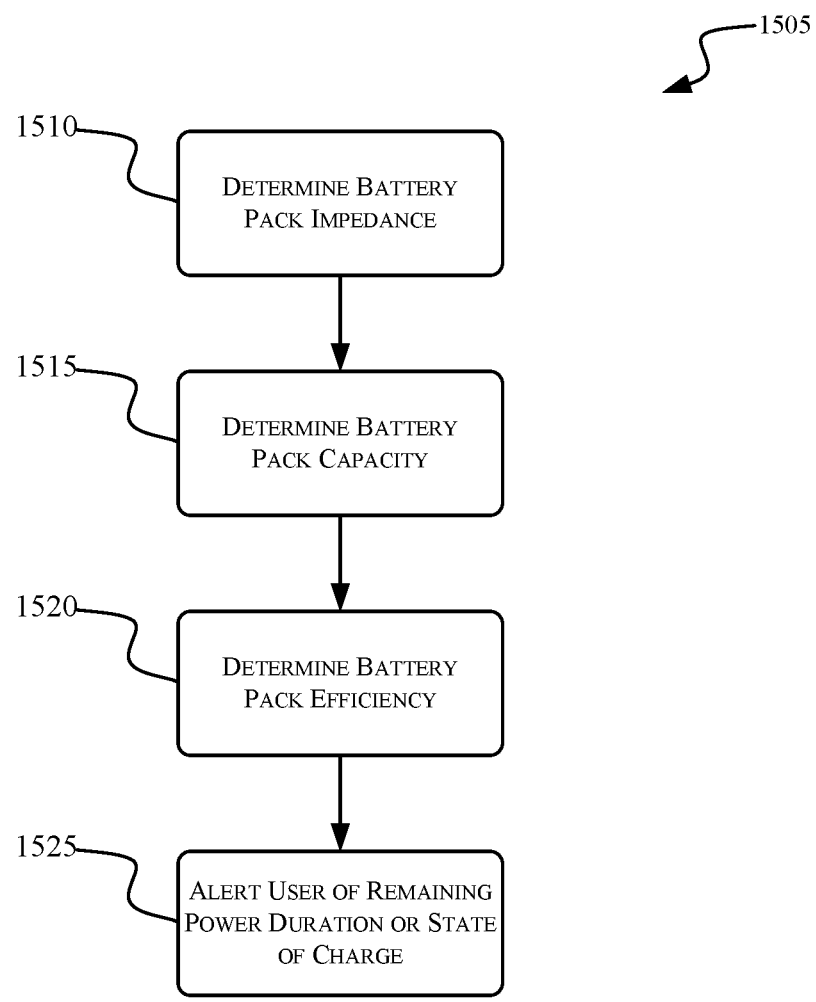

Another embodiment of using the detected battery pack impedance includes power supplies, or general tool LED indicators for battery health alerts. For example, FIG. 15A illustrates a power supply 1500. FIG. 15B illustrates a method 1505 using battery pack impedance to alert a user of remaining power or the state of charge. The method 1505 determines the impedance of the power supply 1500's battery pack using one of the methods described above (STEP 1510). Using the battery pack impedance, the battery pack's capacity can be determined (STEP 1515). From the battery pack's capacity, the efficiency of the battery pack is determined or estimated (STEP 1520). Based on the battery pack capacity and efficiency, a user can be alerted of the remaining power duration of the power supply 1500 (e.g., based on present discharge rate). Additionally or alternatively, based on the capacity and efficiency of the battery pack, a user can be alerted to the state of charge of the battery pack that is currently being charged or discharged (STEP 1525).

Another embodiment of using the detected battery pack impedance includes power tools, power tool battery packs, battery pack warmers, heated jackets, etc., for allowing warming of battery cells and/or the prevention of overheating. The batteries impedance is affected by the battery pack's temperature. A power tool may use an impedance measurement to estimate the battery pack's temperature and/or suitability for use (e.g., a small battery pack trying to power a chainsaw). The battery pack may be in a less than ideal state if too cold. If too cold, a power tool may elect to warm the battery pack. For example. the power tool may run a lower current to simply warm the battery pack as part of a battery pack heat-up procedure (e.g., via a separate resistor circuit) or selectively drive warm airflow over the battery. The output of the power tool may be decoupled during this process. Alternatively, a power tool could also elect to warn a user prior to running the power tool or have a reduced power output during use. A battery warming device may also use the impedance method to gauge if the battery pack should be warmed (e.g., through a motor fan or resistive/inductor wires). If the battery pack is instead too warm, a power tool may elect to reduce temperature to avoid overheating the battery pack and causing a shutdown. The output of the power tool may be decoupled during this process. Alternatively, a power tool (or heated jacket 1600) may use an estimate of the battery pack's temperature to help estimate ambient thermal models for the power tool.

Figure 16A:
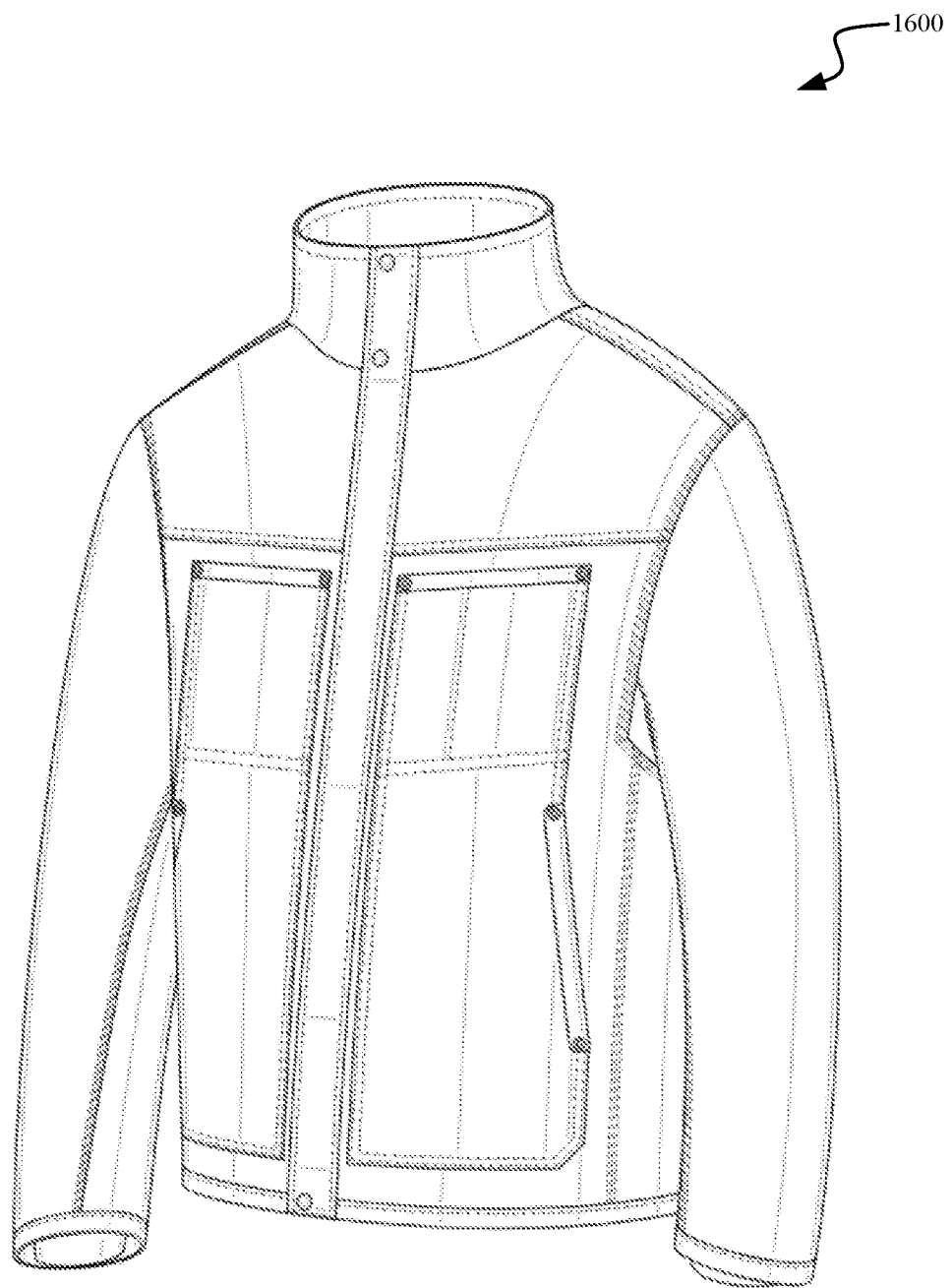
FIGS. 16A and 16B illustrate another embodiment of a device and method for determining an impedance of a battery pack attached to the device.
Figure 16B:
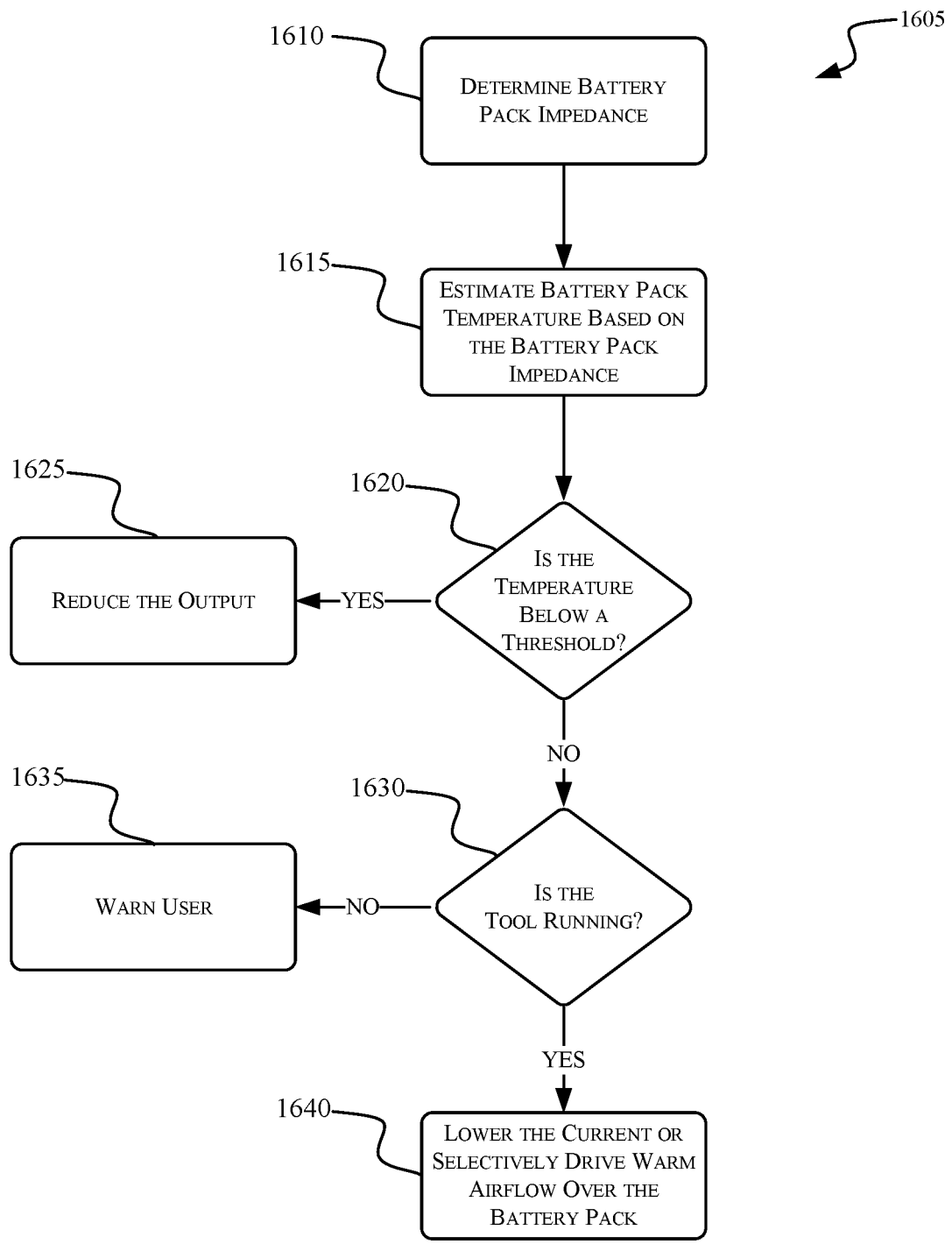

For example, FIG. 16A illustrates a heated jacket 1600. FIG. 16B illustrates a method 1605 using battery pack impedance to reduce the output or current of the power tool (or heated jacket 1600) depending on the estimated temperature. The method 1605 determines the impedance of the battery pack using one of the methods described above (STEP 1610). Using the battery pack impedance, the battery pack's temperature can be determined or estimated (STEP 1615). The temperature is then compared to a threshold (STEP 1620). Each battery pack has a typical impedance, which may be communicated to the tool. If the determined or estimated battery pack impedance differs significantly from the typical impedance, there is a possibility that the battery pack is at a different temperature. If the determined or estimated temperature is above the threshold, the method 1605 includes reducing the output of the battery pack (e.g., power, speed, ramp slope, etc.) so that the battery pack itself will not overheat and risk a shutdown of a power tool (STEP 1625). If the determined or estimated temperature is below a threshold, the power tool is determined whether it is currently running (STEP 1630). If the power tool is not on or running, the power tool can elect to warn a user of the low temperature (STEP 1635). If the power tool is currently running, the power tool can elect to warm the battery pack (STEP 1640). The power tool may run a lower current, for instance, which will help raise the temperature of the battery pack. Alternatively, if applicable, a tool can selectively drive warm (or cool, if applicable) airflow over the battery pack. Battery warming devices may also use the battery pack impedance to determine whether the battery pack needs to be warmed, then the battery warming device begins the warming process. Alternatively, the power tool may use the determined or estimated battery pack impedance to assist in determining or estimating ambient thermal models for the power tool. Another embodiment includes monitoring the temperature change, which can be found by monitoring battery pack impedance over time. A sudden drop in battery pack impedance may suggest a battery pack may overheat. In which case, the power tool may elect to reduce output power to prevent overheating.

Another embodiment of using the detected battery pack impedance is directed to power tools that draw large currents. If the battery pack impedance is too high the user should be alerted (e.g., a crib manager) that the battery pack attached is too small for the power tool in order to achieve optimal performance.

Another embodiment of using the detected battery pack impedance is determining the general state of health of a battery pack. Some battery packs report their internal temperature to a power tool. The battery pack's impedance can be measured and, after calibration for the effect of the temperature, a battery pack can determine if the battery quality has significantly reduced over time.

Figure 17A:
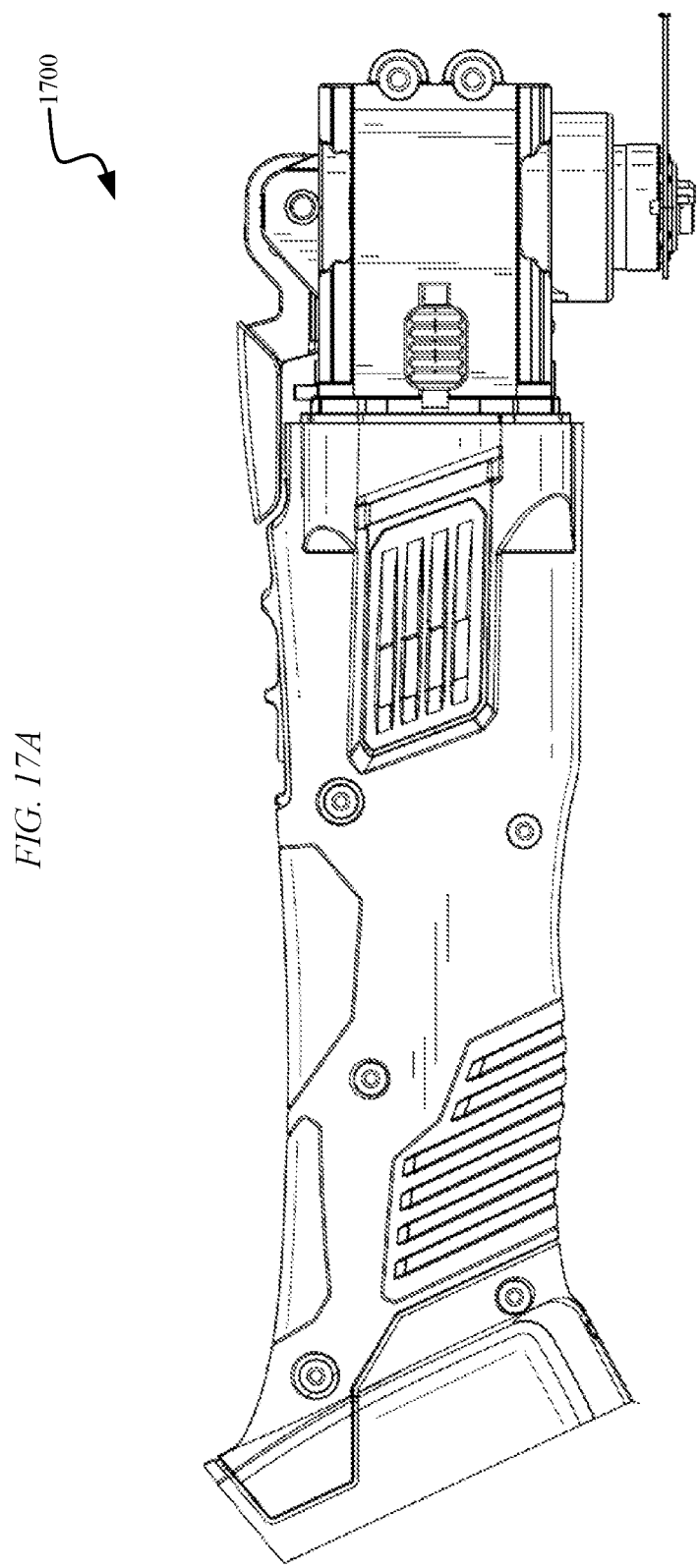
FIGS. 17A, 17B, and 17C illustrate other embodiments of devices and a method for determining an impedance of a battery pack attached to the device.
Figure 17B:
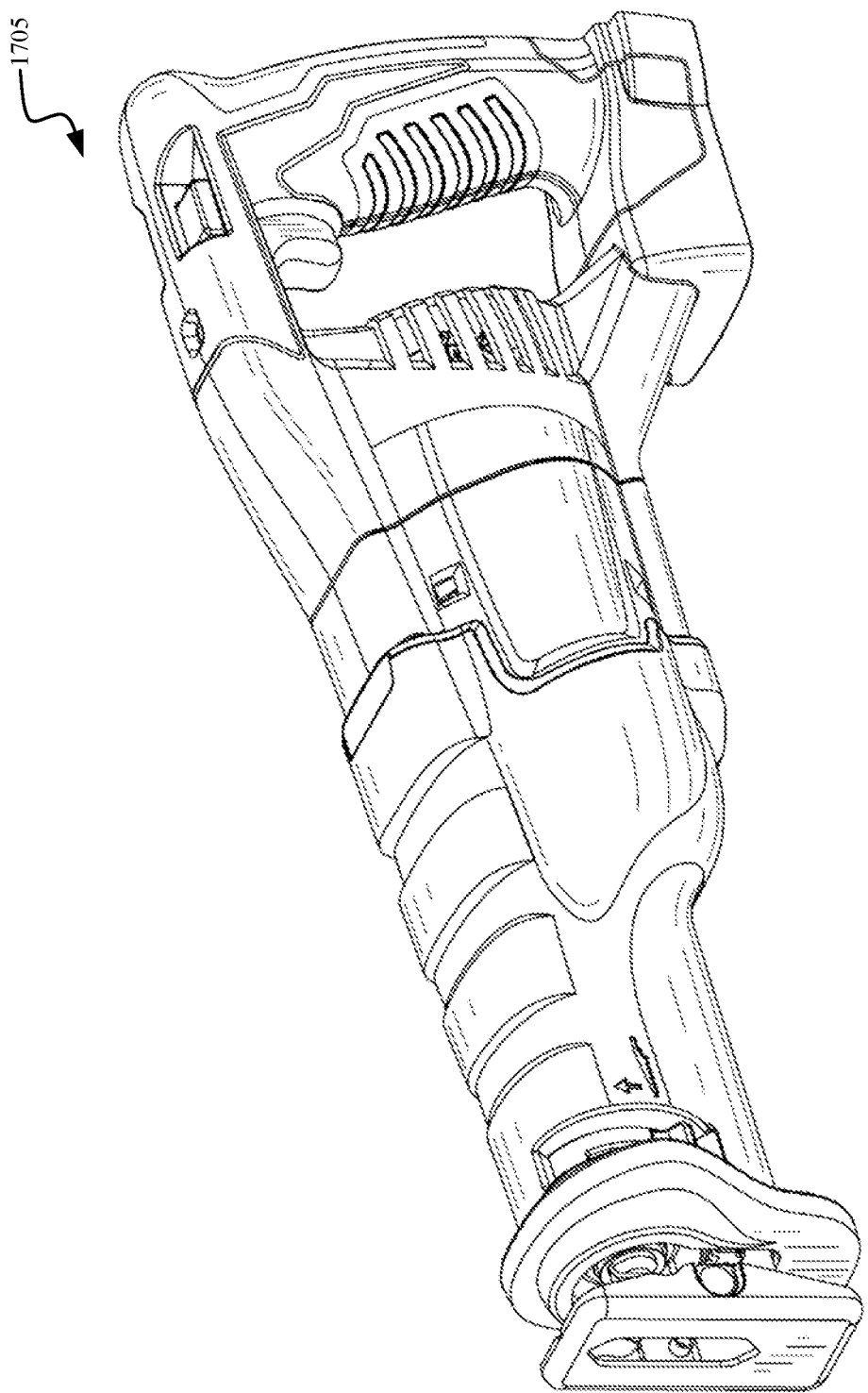
Figure 17C:
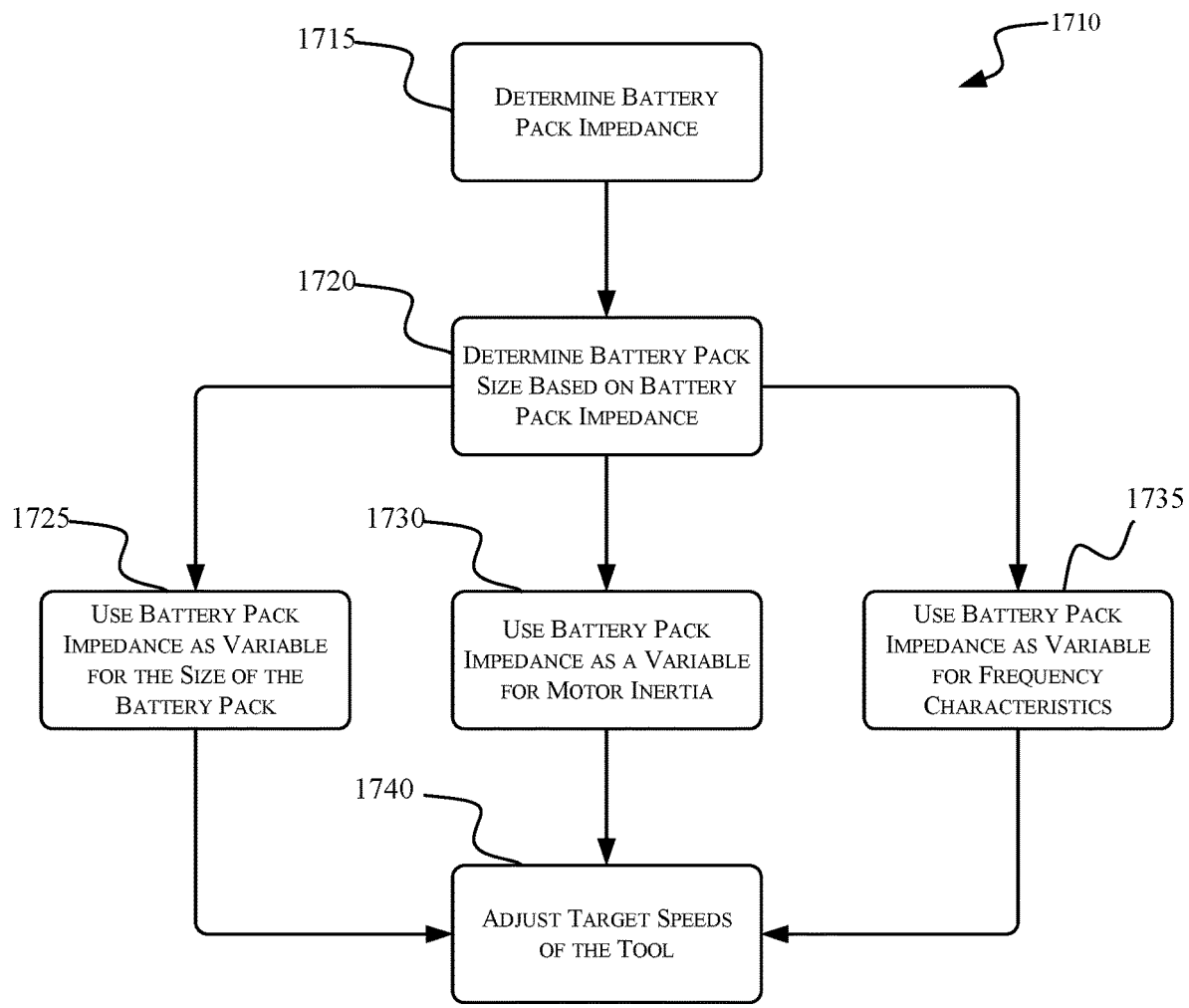

Another embodiment of using the detected battery pack impedance includes multitools, jigsaws, sanders, string trimmers, reciprocating saws, etc., to help reduce vibrational modes. For example, FIG. 17A illustrates a multi-tool 1700, and FIG. 17B illustrates a reciprocating saw 1705. Both these tools, along with several other tools, can implement method 1710 illustrated in FIG. 17C. The method 1710 includes determining the impedance of the battery pack using one of the methods described above (STEP 1715). Using the battery pack impedance, the battery pack's size can be determined (STEP 1720). The battery pack impedance is then used as a variable for the multi-tool 1700 or reciprocating saw 1705's battery size (e.g., Ampere-Hour capacity). Along with battery size, the battery pack impedance is also used as a variable for both motor inertia (e.g., high or low motor inertia) (STEP 1730), and frequency characteristics (e.g., resonant frequency) (STEP 1735). Using all three of these variables, the target speeds of the multi-tool 1700 or reciprocating saw 1705 are adjusted to prevent the tool from reaching a suspected resonant frequency of the tool. This allows for reduced vibration of the tool.

Another embodiment of using the detected battery pack impedance is to warn or prevent a user from using a battery pack on a power tool that will not perform well. For instance, a user may find that a high demanded chainsaw will not perform well with a smaller, high impedance battery. Warnings could include flashing lights on the battery pack or power tool. Warnings could also include message alerts via text messaging, applications, email, or dashboard via a connected IoT infrastructure. Other individuals may also be alerted that incorrectly sized batteries are being used.

Another embodiment of using the detected battery pack impedance is to validate that the battery pack attached to the power tool is genuine. If a competitor battery pack is attached to the power tool, where the detected battery pack impedance is out of an established range, the power tool may not elect to use the attached battery pack.

Another embodiment of using the detected battery pack impedance includes a pipe fusion tool. Pipe fusion tools heat pipes such as HDPE natural gases lines to fuse them together. This requires a large supply of thermal energy for a given pipe size, preferably delivered at a high rate. The battery pack impedance measurement can gauge if the battery pack will be able to deliver the rate of energy needed and if the remaining capacity of the battery is likely to suffice for the application of the power tool. Such a power tool would not allow an application of the power tool to begin if the power tool would not be able to complete the entire application. The battery pack operated pipe fusion tool for fusing together HDPE natural gas lines requires a minimum amount of battery energy to convert to thermal energy, which in turn completes one cycle for a given pipe size. Such a power tool would take advantage of the detected battery pack impedance by allowing the power tool to help predetermine the energy remaining in the battery pack before executing the last cycle.

Another embodiment of using the detected battery pack impedance includes Internet-of-Things tools for battery usage tracking. Using the detected battery pack impedance, the size of the battery is determined. A tool then communicates the battery pack usage information to the cloud (e.g., via Bluetooth, cellular data, WiFi, etc.) either directly, via hubs, or via cellular phones. The information communicated to the cloud can then be used for analytical purposes, whether for personal records, tool manufactures, targeted outreach, etc., or for battery tracking. This allows more efficient battery usage.

Another embodiment of using the detected battery pack impedance includes tools and batteries for warrantee and repairs. By measuring the detected battery pack impedance, this data can be logged (e.g., in flash, EEPROM storage, etc.). If the tools or batteries need repair, the logged data of the detected battery impedance can be used for diagnosing issues with the product. For example, if the detected battery voltage is low, the batteries may use a higher current which can cause overheating of the motor. As another example, using the detected battery impedance can tell how the battery pack has aged, and therefore is easier to repair the battery pack or know when to replace the battery pack. Another embodiment of using the detected battery pack impedance includes tool calibration. The battery pack may know the battery pack's true impedance (e.g., calibrated at a time of charging on a precision charger or with a parameter at manufacturing or via a model). The measurement of the power tool that goes through the windings of the motor may take the difference in the estimated battery pack impedance (including the impedance of the windings) to derive the impedance of the power tool. The impedance of the power tool can then be used to compensate for more or less expected motor efficiencies and output.

Another embodiment of using the detected battery pack impedance assists in determining how suitable a battery pack is for regenerative braking. For some desired output, it may be helpful to only allow some battery packs to significantly recharge while a power tool (e.g., a grinder) brakes. It may be desirable to limit the charging rate back into the battery pack depending on the battery pack impedance (along with the battery pack voltage).

Another embodiment of using the detected battery pack impedance method is to use the same method to characterize a power supply that is directly used to power a tool. Such a power tool may be in the form of a corded adapter that engages the battery pack receiving component of the power tool. The impedance measurement of the power supply should be brief enough to avoid causing an overload shutdown. Such a power supply could also be a corded adapter that engaged with a larger secondary battery source or other power source (e.g., gas inverter). The impedance may be in a range that suggested it is a power supply for which the power tool may elect to change its performance. For example, the power tool may choose to limit maximum output to avoid tripping any protective circuitry (e.g., fuses, breakers). For example, the power tool may assume its runtime could be extended and avoid power-saving performance characteristics. The power supply's capacitance may also be detectable. The detected capacitance can be used to determine how much the power supply can support transient loadings. This information can be helpful for motor control and if a power tool should allow itself to operate.

The aforementioned pulse-technique occurs in some embodiments. One embodiment includes directly applying the pulse before the first trigger pull and after a battery pack has been attached to a power tool. In another embodiment, the pulse is applied immediately after a battery pack has been attached to a power tool. In another embodiment, the pulse is applied after a battery pack has been attached to a power tool with a time delay. In another embodiment, the pulse is applied only on a first trigger pull, but not on subsequent trigger pulls until the battery has been switched. In another embodiment, the pulse is applied on the occasion where the battery pack is being warmed. In another embodiment, the pulse-technique could be used during operation (e.g., for fans, lights, etc.). The pulse-technique may also be used in combinations of the above-described embodiments. In some embodiments, a power tool could elect to assume a default impedance if the power tool had not measured the impedance (or was unable to ascertain the impedance in a typical range).

Another embodiment of using the detected battery pack impedance includes chargers. This methodology assists with estimating which battery pack is attached, then allows quicker estimations of charge time, remaining capacity that may be displayed to a user, charge sharing between battery packs, and other charging factors.

Another embodiment of using the detected battery pack impedance includes altering protective thresholds, thermal models, state-of-charge models, state-of-health models, and other factors based on updated impedance measurements. A temperature input on from a thermocouple or thermistor may also be used with the impedance calculation.

Detected battery impedance and/or battery inertia are used as inputs into an application (e.g., for torque control in impacts or clutches in drills). These inputs in these applications may alternatively be ascertained in other ways, including but not limited to the battery pack electrically or mechanically communicating to the tool parameters that speak to these inputs, or by estimating from battery inrush on tool sensors, or by estimating during a more continuous loading of a power tool.

In some embodiments, EQN. 2 can be used to compensate PWM signals in a nonlinear way for both the battery pack voltage and battery pack resistance. Using EQN. 2 may negate the need to formally calculate the impedance of the battery pack, and instead measure $\Delta$ voltage and $\Delta$ current, which can be used as raw inputs to algorithms, as shown below in EQN. 2.

$$\text{PWM}_{compensated} = \text{PWM}_{desired} - \alpha V_0 + \beta \Delta_V + \gamma \Delta_i^2 \qquad \text{EQN. 2}$$

Thus, embodiments described herein provide, among other things, systems and methods for determining the impedance of a battery pack. Various features and advantages are set forth in the following claims.

What is claimed is:

1. A battery pack powered device comprising:
   a housing including a battery pack interface configured to receive a battery pack;
   a first sensing circuit configured to detect a battery pack voltage of the battery pack;
   a second sensing circuit configured to detect a current from the battery pack; and
   a controller including a processor and a memory, the controller configured to:
   receive a first signal from the first sensing circuit related to a first measurement of battery pack voltage,
   receive a second signal from the second sensing circuit related to the current from the battery pack,
   receive a third signal from the first sensing circuit related to a second measurement of battery pack voltage,
   determine a battery pack impedance based on the first measurement of battery pack voltage, the second measurement of battery pack voltage, and the current from the battery pack, and
   control the battery pack powered device by adjusting motor control parameters of a motor of the battery pack powered device based on the battery pack impedance.

2. The battery pack powered device of claim 1, wherein the battery pack powered device is operable to determine a battery pack type for the battery pack connected to the battery pack interface based on the battery pack impedance.

3. The battery pack powered device of claim 1, wherein the battery pack powered device is operable to at least one of:
   determine a frequency characteristic based on the battery pack impedance;
   determine a motor inertia based on the battery pack impedance; or
   determine a size of the battery pack based on the battery pack impedance.

4. The battery pack powered device of claim 1, wherein the battery pack powered device is operable to:
   estimate a battery pack temperature based on the battery pack impedance; and
   reduce an output power of the battery pack when the battery pack temperature is above a predetermined threshold.

5. The battery pack powered device of claim 1, wherein the battery pack powered device is operable to:
   determine that the battery pack has a high battery pack impedance; and
   adjust the motor control parameters of the motor to increase torque delivery when the battery pack has the high battery pack impedance.

6. The battery pack powered device of claim 1, wherein the battery pack powered device is operable to determine a battery pack capacity based on the battery pack impedance.

7. The battery pack powered device of claim 6, wherein the battery pack powered device is operable to determine a battery pack efficiency based on the battery pack capacity.

8. The battery pack powered device of claim 7, wherein the power tool is operable to alert a user of a state of charge of the battery pack.

9. A method for controlling a battery pack powered device, the method comprising:
   receiving a first signal from a first sensing circuit related to a first measurement of battery pack voltage of a battery pack;
   receiving a second signal from a second sensing circuit related to a current from the battery pack;
   receiving a third signal from the first sensing circuit related to a second measurement of battery pack voltage;
   determining a battery pack impedance based on the first measurement of battery pack voltage, the second measurement of battery pack voltage, and the current from the battery pack; and
   controlling the battery pack powered device by adjusting motor control parameters of a motor of the battery pack powered device based on the battery pack impedance.

10. The method of claim 9, further comprising determining a battery pack type for the battery pack based on the battery pack impedance.

11. The method of claim 9, further comprising at least one of:
   determining a frequency characteristic based on the battery pack impedance;
   determining a frequency characteristic based on the battery pack impedance; and
   determining a size of the battery pack based on the battery pack impedance.

12. The method of claim 9, further comprising:
   estimating a battery pack temperature based on the battery pack impedance; and
   reducing an output power of the battery pack when the battery pack temperature is above a predetermined threshold.

13. The method of claim 9, further comprising:
   determining that the battery pack has a high battery pack impedance; and
   adjusting the motor control parameters of the motor to increase torque delivery when the battery pack has the high battery pack impedance.

14. The method of claim 9, further comprising:
   determining a battery pack capacity based on the battery pack impedance; and
   alerting a user of a state of charge of the battery pack.

15. A power tool comprising:
   a housing including a handle and a battery pack interface;
   a motor within the housing, the motor including a rotor and a stator, the rotor coupled to a motor shaft to produce a rotational output;
   a first sensing circuit configured to detect a battery pack voltage of a battery pack connected to the battery pack interface;
   a second sensing circuit configured to detect a current from the battery pack;
   a controller including a processor and a memory, the controller configured to:
      receive a first signal from the first sensing circuit related to a first measurement of battery pack voltage,
      receive a second signal from the second sensing circuit related to the current from the battery pack,
      receive a third signal from the first sensing circuit related to a second measurement of battery pack voltage,
      determine a battery pack impedance based on the first measurement of battery pack voltage, the second measurement of battery pack voltage, and the current from the battery pack, and
      control the motor by adjusting motor control parameters of the motor based on the battery pack impedance.

16. The power tool system of claim 15, wherein the power tool is operable to at least one of:
   determine a frequency characteristic based on the battery pack impedance;
   determine a motor inertia based on the battery pack impedance; or
   determine a size of the battery pack based on the battery pack impedance.

17. The power tool of claim 15, wherein the power tool is operable to:
   estimate a battery pack temperature based on the battery pack impedance; and
   reduce an output power of the battery pack when the battery pack temperature is above a predetermined threshold.

18. The power tool of claim 15, wherein the power tool is operable to determine a battery pack capacity based on the battery pack impedance.

19. The power tool of claim 18, wherein the power tool is operable to determine a battery pack efficiency based on the battery pack capacity.

20. The power tool of claim 19, wherein the power tool is operable to alert a user of a state of charge of the battery pack.

* * * * *